(12) United States Patent
Okanobu

(10) Patent No.: US 7,728,668 B2
(45) Date of Patent: Jun. 1, 2010

(54) VARIABLE-GAIN AMPLIFICATION CIRCUIT, RECEIVER AND RECEIVER IC

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/024,193

(22) Filed: Feb. 1, 2008

(65) Prior Publication Data

US 2008/0186100 A1 Aug. 7, 2008

(30) Foreign Application Priority Data

Feb. 5, 2007 (JP) ............................ 2007-025309

(51) Int. Cl.
*H03F 3/45* (2006.01)

(52) U.S. Cl. ..................................... 330/254

(58) Field of Classification Search ............. 330/124 R, 330/254, 261, 295; 327/359; 455/234.1, 455/234.2
See application file for complete search history.

(56) References Cited

U.S. PATENT DOCUMENTS 6,078,219 A * 6/2000 Hadjichristos et al. ...... 330/254
2004/0164784 A1* 8/2004 Umeda et al. ................ 327/355

FOREIGN PATENT DOCUMENTS

JP    2005-312016    11/2005

* cited by examiner

*Primary Examiner*—Robert Pascal
*Assistant Examiner*—Khiem D Nguyen
(74) *Attorney, Agent, or Firm*—Sonnenschein Nath & Rosenthal LLP

(57) ABSTRACT

Disclosed herein is a variable-gain amplification circuit, wherein the sources of first and second MOSFETs (Metal Oxide Semiconductor Field Effect Transistors) are tied to a common connection point connected to a current source. An input signal is supplied to the gates of the first and second MOSFETs. The drains of the first and second MOSFETs are connected to the sources of third and fourth MOSFETs respectively whereas the drains of the third and fourth MOSFETs are connected to two output terminals respectively, a gain control voltage is supplied to the gates of both the third and fourth MOSFETs. When control is executed in order to lower the gain control voltage supplied to the gates of both the third and fourth MOSFETs, other control is also executed in order to raise a bias voltage applied to the gates of both the first and second MOSFETs.

11 Claims, 21 Drawing Sheets

VARIABLE-GAIN AMPLIFICATION CIRCUIT, RECEIVER AND RECEIVER IC

CROSS REFERENCES TO RELATED APPLICATIONS

The present invention contains subject matter related to Japanese Patent Application JP 2007-025309 filed with the Japan Patent Office on Feb. 5, 2007, the entire contents of which being incorporated herein by reference.

BACKGROUND OF THE INVENTION

1. Field of the Invention

The present invention relates to a variable-gain amplification circuit, a receiver, which makes use of the variable-gain amplification circuit as a high-frequency amplification circuit having an AGC (automatic gain control) function, and a receiver IC.

2. Description of the Related Art

There is known a variable-gain amplification circuit with few small distortions as disclosed in documents such as Japanese Patent Laid-open No. 2005-312016 referred to as Patent Document 1 hereinafter. The variable-gain amplification circuit employs transistors and/or MOSFETs (Metal Oxide Semiconductor Field Effect Transistors). The transistors and/or MOSFETs employed in the variable-gain amplification circuit are connected to each other by use of cascade coupling.

The variable-gain amplification circuit has a configuration like one shown in FIG. 21. For example, the variable-gain amplification circuit shown in FIG. 21 is employed as a high-frequency amplifier in a TV tuner. The high-frequency amplifier has an AGC (automatic gain control) function to make the output signal level fixed for an input signal level higher than a level determined in advance.

In the typical configuration shown in FIG. 21, MOSFETs 1 and 2 are connected to each other by use of cascode coupling. To put it in detail, the drain of the MOSFET 1 is connected to the source of MOSFET 2 and the source of the MOSFET 1 is connected to a ground terminal. The drain of the MOSFET 2 is connected to a power-supply line of a voltage power supply +Vcc through a coil L1 and connected to the terminal of the ground through a variable-capacitance capacitor Cv2. The drain of the MOSFET 2 is also connected to an output terminal.

An input signal is supplied to the gate of the MOSFET 1 by way of a transformer T1, a variable-capacitance capacitor Cv1 and a capacitor C1. The secondary coil of the transformer T1 and the variable-capacitance capacitor Cv1 form a tuning circuit.

An AGC voltage Vagc is supplied to the gate of the MOSFET 2. The gate of the MOSFET 2 is connected to the terminal of the ground through a capacitor Co.

In addition, in this typical configuration, between the power-supply line of the voltage power supply +Vcc and the terminal of the ground, a resistor R1 and MOSFETs 3 and 4 are connected to each other to form a series circuit. To be more specific, the source of the MOSFET 3 is connected to the drain of the MOSFET 4. The gate of the MOSFET 3 is connected to the gate of the MOSFET 2 whereas the gate of the MOSFET 4 is connected to the gate of the MOSFET 1.

In the typical configuration shown in FIG. 21, the AGC voltage Vagc supplied to the gate of the MOSFET 2 is generated by a circuit provided at a stage following this variable-gain amplification circuit. For an input signal level higher than a level determined in advance, the AGC voltage Vagc is reduced. With the AGC voltage Vagc reduced, the voltage appearing between the drain and source of the MOSFET 1 is also reduced, driving the MOSFET 1 to a three-pole tube region. In this region, the gain of the variable-gain amplification circuit starts to decrease and the variable-gain amplification circuit works as a variable-gain amplifier. The variable-gain amplification circuit having a configuration shown in FIG. 21 is known as a variable-gain amplifier having small distortions.

SUMMARY OF THE INVENTION

By the way, FIG. 22 is a diagram showing curves representing changes of the gain of the variable-gain amplification circuit shown in FIG. 21 and changes of a current Id flowing through the MOSFETs 1 and 2 employed in the variable-gain amplification circuit. The changes are caused by gain control executed on the variable-gain amplification circuit. In the diagram of FIG. 22, the horizontal axis represents the AGC voltage Vagc, the vertical axis on the left-hand side represents the gain and the vertical axis on the right-hand side represents the current.

As shown in FIG. 22, even if the gain is substantially reduced from 0 dB to −20 dB, the current Id hardly decreases.

Thus, in the case of an application in which the range of changes of the input signal level is wide, variable-gain amplifiers shown in FIG. 21 are connected to each other at a number of stages to form a multi-stage variable-gain amplification circuit as disclosed in Patent Document 1. A selected one of the variable-gain amplifiers is turned off while another one is turned on in switching from one variable-gain amplifier to another in order to reduce the gain of the variable-gain amplification circuit in accordance with the level of the input signal. In this case, however, the level of the consumed current at a reduced gain undesirably increases to a value proportional to the number of aforementioned stages, raising a problem that the variable-gain amplifier (or the single-stage variable-gain amplification circuit) and the multi-stage variable-gain amplification circuit are each not a proper circuit to be implemented as an IC (Integrated Circuit).

Addressing the problem described above, the present invention provides a variable-gain amplification circuit that is capable of effectively preventing the consumed current from increasing so as to reduce the power consumption even if the variable-gain amplification circuits provided at a number of stages are connected to each other and, thus, provides a proper circuit to be implemented as an IC.

In order to solve the problem described above, the present invention provides a variable-gain amplification circuit in which:

the sources of first and second MOSFETs (Metal Oxide Semiconductor Field Effect Transistors) are tied to a common connection point connected to a current source;

an input signal is supplied to the gates of the first and second MOSFETs;

the drains of the first and second MOSFETs are connected to the sources of third and fourth MOSFETs respectively whereas the drains of the third and fourth MOSFETs are connected to two output terminals respectively, and a gain control voltage is supplied to the gates of both the third and fourth MOSFETs; and when control is executed in order to lower the gain control voltage supplied to the gates of both the third and fourth MOSFETs, other control is executed in order to raise a gate bias voltage applied to the gates of both the first and second MOSFETs.

In the configuration described above, when control is executed in order to lower the gain control voltage supplied to the gates of both the third and fourth MOSFETs, the first and second MOSFETs both operate in a three-pole tube region, which reduces the gains of the first and second MOSFETs. As described above, when control is executed in order to lower the gain control voltage supplied to the gates of both the third and fourth MOSFETs, other control is executed in order to raise a gate bias voltage applied to the gates of both the first and second MOSFETs so that the on-resistances of the first and second MOSFETs decrease, contributing the reduction of the gains of the first and second MOSFETs.

In addition, when control is executed in order to lower the gain control voltage supplied to the gates of both the third and fourth MOSFETs, the other control is executed in order to raise a gate bias voltage applied to the gates of both the first and second MOSFETs so that the on-resistances of the first and second MOSFETs decrease as described above. Thus, the voltage between the drain and the source in each of the first and second MOSFETs also decreases so that the source electric potential common to the first and second MOSFETs can be prevented from decreasing.

Thus, even if the current source making use of MOSFETs is employed, the MOSFETs can be prevented from operating in a three-pole tube region. In addition, control to adjust the current generated by the current source can be executed as part of the gain control.

Also, when the variable-gain amplification circuit in accordance with the present embodiment as described above is provided at a number of stages connected to each other to form a multi-stage variable-gain amplification circuit, the current generated by the current source can be controlled in order to turn off a selected one of the variable-gain amplifiers and turn on another one in switching from one variable-gain amplifier to another in order to execute the gain control over a wide range of signal-level changes without much increasing the current consumed by the whole multi-stage variable-gain amplification circuit. Thus, the multi-stage variable-gain amplification circuit is a proper circuit to be implemented as an IC.

In accordance with the present embodiment, even if the single-stage variable-gain amplification circuits provided at a number of stages as variable-gain amplification circuits are connected to each other to form a multi-stage variable-gain amplification circuit, it is possible to execute the gain control causing small noises and small distortions over a wide range of signal-level changes without much increasing the current consumed by the whole multi-stage variable-gain amplification circuit. Thus, the single-stage and multi-stage variable-gain amplification circuits are each a proper circuit to be implemented as an IC.

BRIEF DESCRIPTION OF THE DRAWINGS

These and other objects and features of the present invention will become clear from the following description of the preferred embodiments given with reference to the accompanying diagrams, in which.

DETAILED DESCRIPTION OF THE PREFERRED EMBODIMENTS

By referring to diagrams, embodiments each implementing a variable-gain amplification circuit according to the present embodiment are explained.

[Typical Configuration of the Principle]

Figure 1:
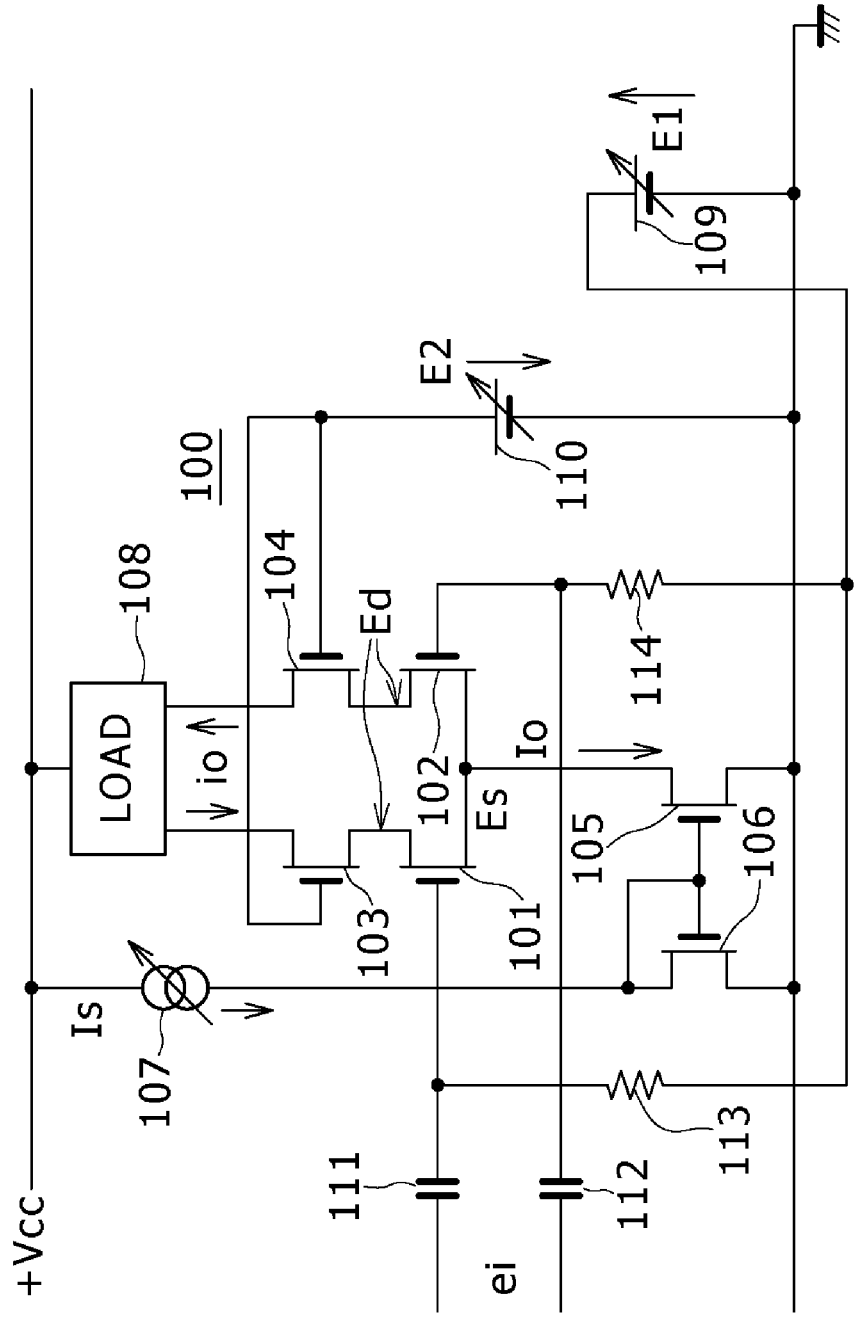
FIG. 1 is a diagram showing the configuration of an equivalent circuit of a variable-gain amplification circuit according to the present embodiment.

FIG. 1 is a diagram showing the configuration of an equivalent circuit implementing the principle of an embodiment implementing a single-stage variable-gain amplification circuit 100 according to the present embodiment. As shown in FIG. 1, the single-stage variable-gain amplification circuit 100 has the configuration of a differential amplifier employing first, second, third and fourth MOSFETs 101, 102, 103 and 104 connected to each other by use of cascode coupling.

To put it in detail, the sources of the first and second MOSFETs 101 and 102 are tied to a common connection point connected to a ground terminal through the drain and source of a current-source MOSFET 105 employed in a current source having a current-mirror configuration.

An input signal ei is applied to the gates of the first and second MOSFETs 101 and 102 through capacitors 111 and 112 respectively. In addition, a gate bias voltage E1 generated by a variable-voltage source 109 is also supplied to the gates of the first and second MOSFETs 101 and 102 through resistors 113 and 114 respectively.

The gate and drain of a MOSFET 106 are connected to each other. A MOSFET with the gate and drain thereof connected to each other is referred to as a diode-connected MOSFET. The MOSFET 106 is connected to a variable-current source 107 to form a series circuit. That is to say, the MOSFET 106 and the variable-current source 107 form a series circuit incorporated in the single-stage variable-gain amplification circuit 100 between the power-supply line of a voltage power supply +Vcc and the terminal of the ground. A connection point common to the gate and drain of the MOSFET 106 is connected to the gate of the current-source MOSFET 105 to form the aforementioned current source having a current-mirror configuration.

The drain of the first MOSFET 101 is connected to one of two terminals of a load 108 through the source and drain of the third MOSFET 103. By the same token, the drain of the second MOSFET 102 is connected to the other terminal of the load 108 through the source and drain of the fourth MOSFET 104. In this way, the drains of the third and fourth MOSFETs 103 and 104 serve as differential output terminals of the single-stage variable-gain amplification circuit 100.

The gates of the third and fourth MOSFETs 103 and 104 both receive a gain control voltage E2 generated by a variable-voltage source 110.

The gain of the single-stage variable-gain amplification circuit 100 shown in FIG. 1 can be reduced from a maximum value in a maximum-gain state in accordance with the gain control voltage E2. The operation of this gain control will be explained next.

A bias relation in the maximum-gain state of the single-stage variable-gain amplification circuit 100 is explained as follows. The gate bias voltage E1 is equal to the sum of a gate-source voltage Vgso of the first and second MOSFETs 101 and 102 and a saturation drain voltage of the current-source MOSFET 105. The gate-source voltage Vgso is a voltage, which appears between the gate and source of each of the first and second MOSFETs 101 and 102 when a current Io/2 is flowing through each of the first and second MOSFETs 101 and 102. The current Io/2 is half the current Io flowing through the current-source MOSFET 105. The saturation drain voltage of the current-source MOSFET 105 is a voltage, which appears on the drain of the current-source MOSFET 105 with the current-source MOSFET 105 put in a saturated state. (The saturation drain voltage of the current-source MOSFET 105 is thus a voltage Es appearing at a connection point common to the sources of the first and second MOSFETs 101 and 102.) As an example, the following typical values are taken: E1=0.85+0.5=1.35 V.

In addition, the gain control voltage E2 is set at a selected level so that a voltage appearing between the drain and source of each of the first and second MOSFETs 101 and 102 is a voltage, which puts the MOSFETs 101 and 102 in a saturated state and stabilizes the gain of the single-stage variable-gain amplification circuit 100. Let notation Ed denote the drain voltage of each of the first and second MOSFETs 101 and 102. Thus, the gain control voltage E2 is equal to the sum of Ed−Es (>0.5 V~0.7 V), the drain voltage Ed and the gate-source voltage of the third and fourth MOSFETs 103 and 104. As an example, the following typical values are taken: E2=1+0.9+0.5=2.4 V.

In order to reduce the gain from a maximum value in the maximum-gain state, which is the initial state, the single-stage variable-gain amplification circuit 100 shown in FIG. 1 carries out operations to raise the gate bias voltage E1 and lower the gain control voltage E2.

At that time, in the single-stage variable-gain amplification circuit 100, an electric potential Es appearing at a connection point common to the sources of the first and second MOSFETs 101 and 102 decreases and the operation current remains all but unchanged as long as the operating area of the current-source MOSFET 105 does not enter the three-pole tube region. As the operating area of the current-source MOSFET 105 enters the three-pole tube region, the impedance of a path between the drain and source of the current-source MOSFET 105 decreases, dissatisfying an operation condition of a differential amplifier. With the differential-amplifier operating condition not satisfied, an even-order distortion is generated more easily. It is thus desirable to sustain the electric potential Es appearing at a connection point common to the sources of the first and second MOSFETs 101 and 102 at an approximately constant value.

With the gain control voltage E2 reduced, when the electric-potential difference (Ed−Es) becomes equal to a value putting the operating area of the MOSFETs 101 and 102 in the three-pole tube region, the gain of the single-stage variable-gain amplification circuit 100 starts to decrease. At that time, the electric potential Es appearing at a connection point common to the sources of the first and second MOSFETs 101 and 102 is given as follows:

$$Es=Ed-((Io/2)\times Ro)$$

where notation Ro denotes the output resistance of the first and second MOSFETs 101 and 102.

Thus, in order to sustain the electric potential Es appearing at a connection point common to the sources of the first and second MOSFETs 101 and 102 at an approximately constant value, the output resistance Ro has to be reduced in accordance with a decrease in drain voltage Ed. For this reason, with a timing of the first and second MOSFETs 101 and 102 entering the three-pole tube region, the gate bias voltage E1 is increased to a value greater than the gate bias voltage E1 in the initial state.

With the operating area of the first and second MOSFETs 101 and 102 put in the three-pole tube region, the gain of the single-stage variable-gain amplification circuit 100 is determined in accordance with the voltage between the drain and source of each of the first and second MOSFETs 101 and 102. That is to say, the gain of the single-stage variable-gain amplification circuit 100 is determined in accordance with (Io/2)×Ro. In other words, with an input signal, the output resistance Ro changes, appearing as changes in output current. Thus, the operations to raise the gate bias voltage E1 and reduce the resistance Ro also at the same time have an effect of further decreasing the gain of the differential amplifier, resulting in a big attenuation quantity.

Figure 21:
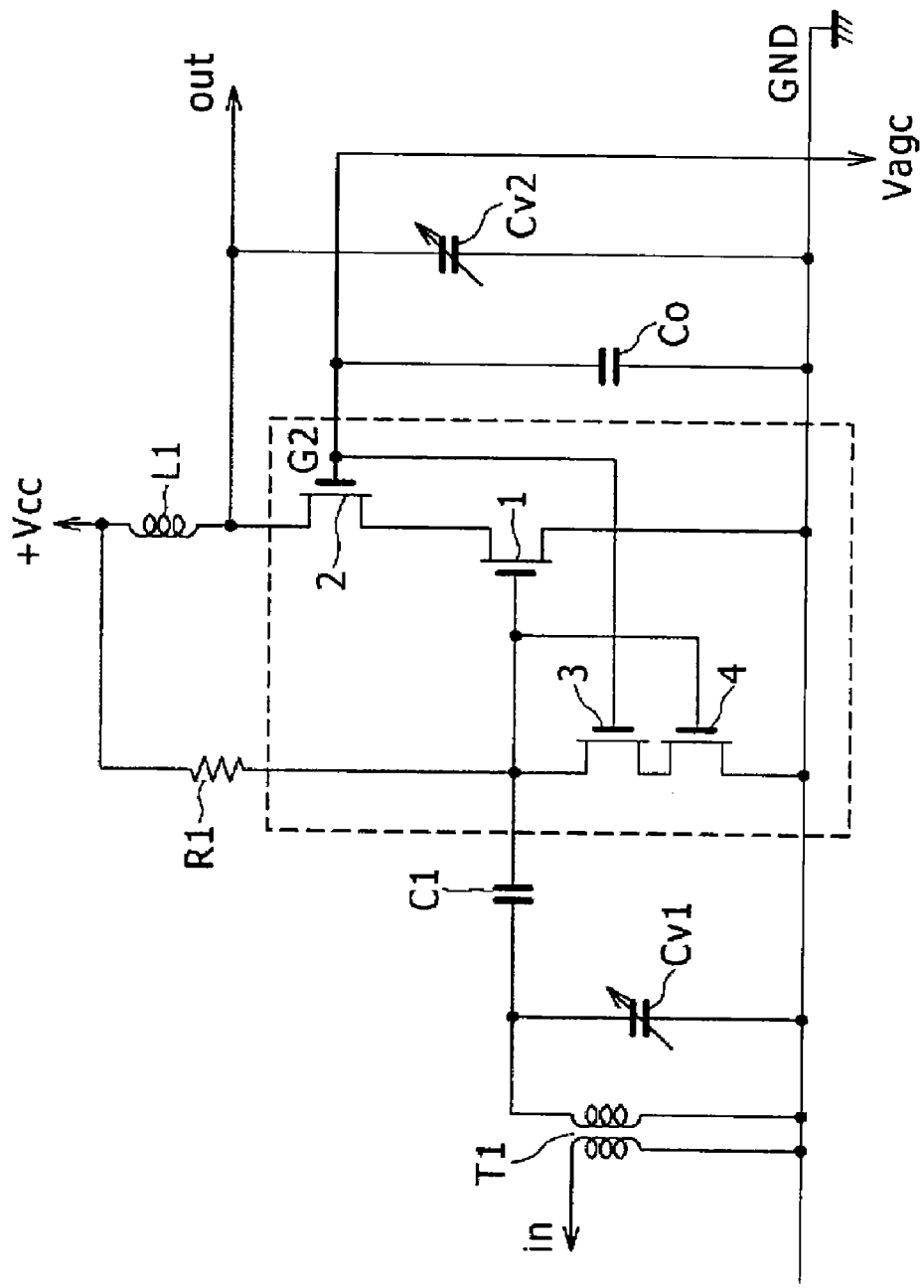
FIG. 21 is a diagram showing a typical variable-gain amplification circuit used in the prior art.
Figure 22:
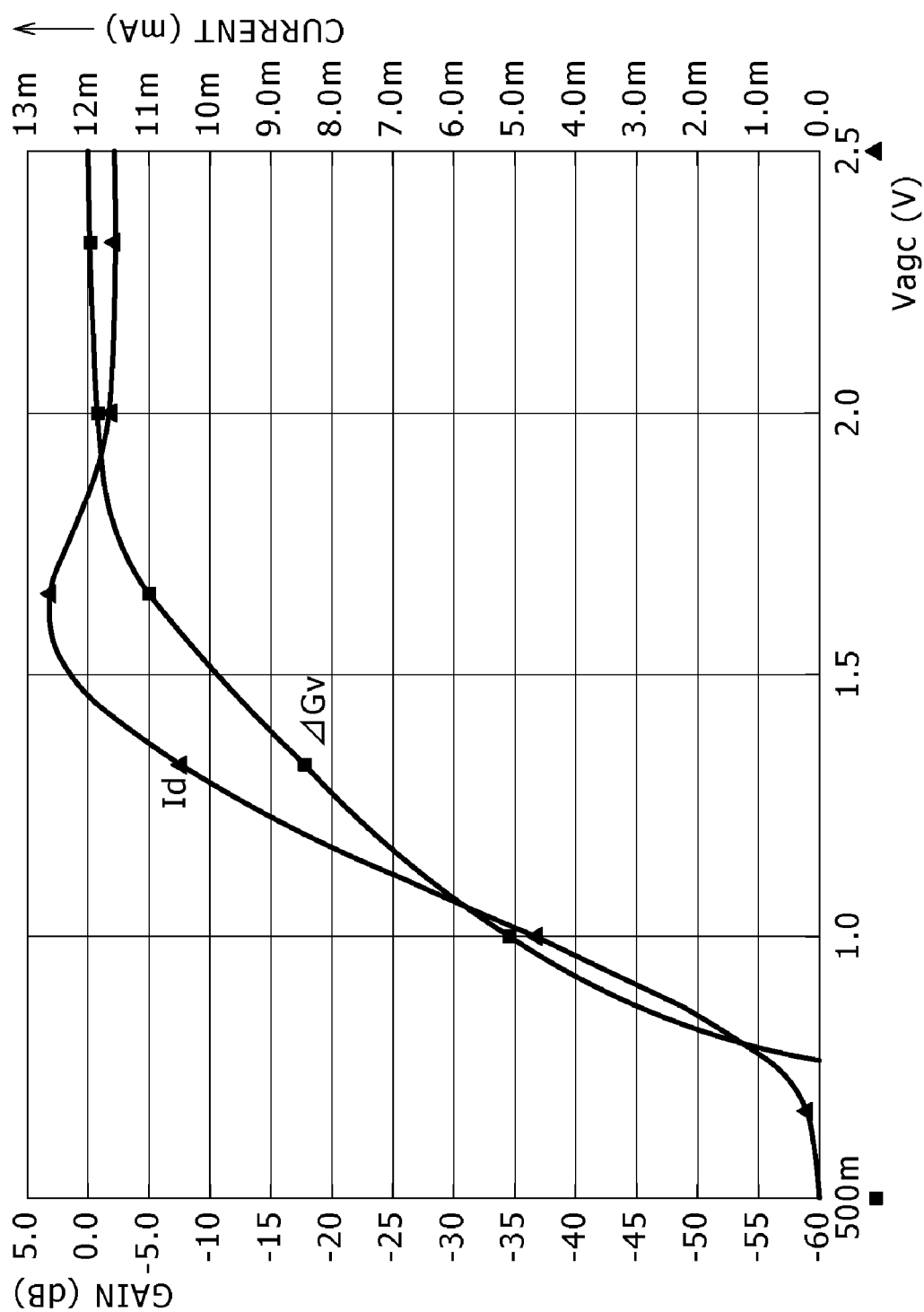
FIG. 22 is an explanatory diagram to be referred to in description of the variable-gain amplification circuit shown in FIG. 21.

As described above, in accordance with the single-stage variable-gain amplification circuit 100 according to the embodiment, the field-proven method for effectively adjusting the gain of a single-end circuit like the one shown in FIG. 21 without causing many distortions can also be adopted in the configuration of a differential amplifier. Thus, while sustaining the low-distortion characteristic, the single-stage variable-gain amplification circuit 100 is capable of reducing the operation current and, hence, the consumed current.

By the way, as described before, in order to satisfy the operating condition of a differential amplifier, it is important to hold the electric potential Es appearing at a connection point common to the sources of the first and second MOSFETs 101 and 102 at an approximately constant value. At the same time, the operation to hold the electric potential Es appearing at a connection point common to the sources of the first and second MOSFETs 101 and 102 at an approximately constant value means that the value of the gain control voltage E2 has a lower limit as follows:

$$E2 > Vgs + Es \quad \text{(Condition equation 1)}$$

If the gain control voltage E2 is reduced to a level lower than the lower limit set by the above condition, the electric potential Es appearing at a connection point common to the sources of the first and second MOSFETs 101 and 102 decreases and, in addition, the operation current Io also decreases as well. It is to be noted that notation Vgs used in condition equation 1 denotes a voltage appearing between the gate and source of each of the third and fourth MOSFETs 103 and 104.

Thus, if the range of variations in input signal is wide, requiring a big attenuation quantity, it is difficult to apply the AGC generating small distortions to a variable-gain amplifier provided at one stage. For this reason, the single-stage variable-gain amplification circuits 100 according to the embodiment are put at a number of stages as variable-gain amplifiers 100 and connected to each other to form a multi-stage variable-gain amplification circuit and a selected one of the variable-gain amplifiers 100 at the stages is turned off while another one is turned on in switching from one variable-gain amplifier 100 to another.

It is to be noted that, in order to eliminate as many distortions as possible, a timing to turn off a selected one of the variable-gain amplifiers 100 and turn on the next one in switching from one variable-gain amplifier 100 to another is set in such a way that the next variable-gain amplification circuit 100 is turned on by avoiding the use of an operating area becoming the three-pole tube region of the current-source MOSFET 105 as much as possible. After the next variable-gain amplification circuit 100 is turned on in switching from one variable-gain amplifier 100 to another, it is desirable to quickly reduce the gain of the entire variable-gain amplification circuit 100.

[Typical Multi-Stage Configurations]

<First Typical Configuration>

Figure 2:
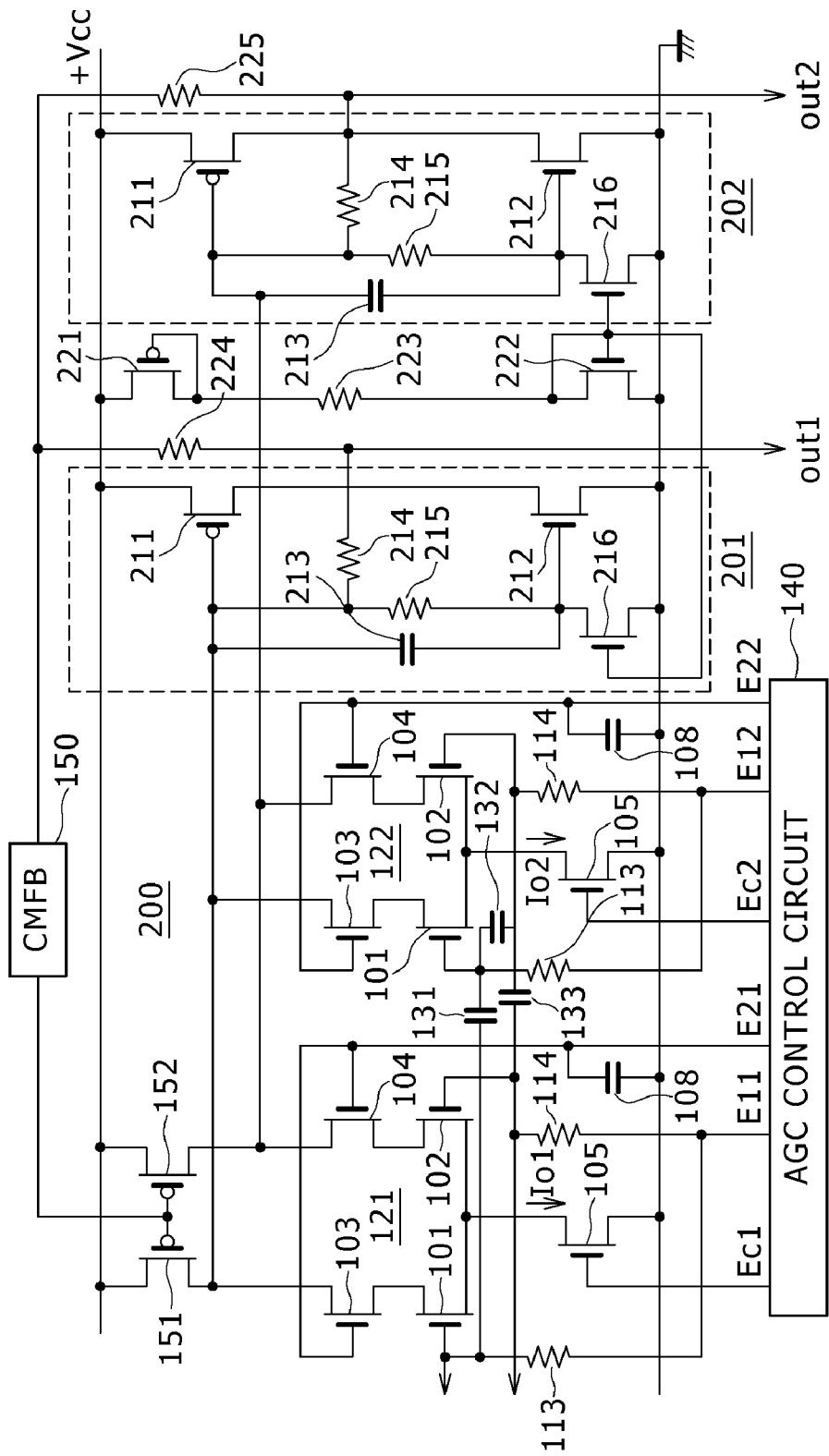
FIG. 2 is a diagram showing a typical configuration of an embodiment implementing a two-stage variable-gain amplification circuit.

FIG. 2 is a diagram showing an embodiment implementing a two-stage variable-gain amplification circuit 200 having a two-stage configuration. As shown in the figure, the two-stage variable-gain amplification circuit 200 includes a first variable-gain amplifier 121 provided at the first stage and a second variable-gain amplifier 122 provided at the second stage. The first variable-gain amplifier 121 and the second variable-gain amplifier 122 each have a configuration identical with the single-stage variable-gain amplification circuit 100 shown in FIG. 1 and carry out the same operations as the single-stage variable-gain amplification circuit 100. It is to be noted that, in order to avoid duplication of explanations, components employed in the first variable-gain amplifier 121 and the second variable-gain amplifier 122 as components each having configurations identical with their counterparts employed in the single-stage variable-gain amplification circuit 100 are denoted in FIG. 2 by the same reference numerals as the counterparts. The denotation making use of the same reference numerals applies to all other typical configurations to be described later.

In the typical configuration shown in FIG. 2, the two-stage variable-gain amplification circuit 200 includes an AGC control circuit 140. The AGC control circuit 140 supplies first and second gain control voltages E21 and E22 to the first variable-gain amplifier 121 and the second variable-gain amplifier 122 respectively in accordance with signals output by the two-stage variable-gain amplification circuit 200. The AGC control circuit 140 also supplies first and second gate bias voltages E11 and E12 to the first variable-gain amplifier 121 and the second variable-gain amplifier 122 respectively in accordance with signals output by the two-stage variable-gain amplification circuit 200. In addition, the AGC control circuit 140 also supplies first and second current-source control voltages Ec1 and Ec2 to the gates of the current-source MOSFETs 105 employed in the first variable-gain amplifier 121 and the second variable-gain amplifier 122 respectively in accordance with signals output by the two-stage variable-gain amplification circuit 200.

To put it in detail, the AGC control circuit 140 supplies the first gain control voltage E21 to the gates of the third and fourth MOSFETs 103 and 104 employed in the first variable-gain amplifier 121. By the same token, the AGC control circuit 140 supplies the second gain control voltage E22 to the gates of the third and fourth MOSFETs 103 and 104 employed in the second variable-gain amplifier 122. In the typical configuration shown in FIG. 2, the gates of the third and fourth MOSFETs 103 and 104 are connected to a ground terminal through a capacitor 108.

The first current-source control voltage Ec1 supplied to the gate of the current-source MOSFET 105 employed in the first variable-gain amplifier 121 determines a current Io1 flowing through the current-source MOSFET 105. By the same token, the second current-source control voltage Ec2 supplied to the gate of the current-source MOSFET 105 employed in the second variable-gain amplifier 122 determines a current Io2 flowing through the current-source MOSFET 105. Thus, the first current-source control voltage Ec1 and the second current-source control voltage Ec2 also function as signals for turning on or off the first variable-gain amplifier 121 and the second variable-gain amplifier 122 respectively in switching from one variable-gain amplifier to another.

In the typical configuration shown in FIG. 2, the input signal is supplied to the gates of the first and second MOSFETs 101 and 102 employed in the first variable-gain amplifier 121 as it is without being attenuated. However, the input signal is divided by capacitors 131, 132 and 133 serving as an attenuator for attenuating the input signal before being supplied to the gates of the first and second MOSFETs 101 and 102 employed in the second variable-gain amplifier 122.

To put it in detail, in the typical configuration shown in FIG. 2, the capacitors 131 to 133 form a series circuit connected between two input terminals. A connection point common to the capacitors 131 and 132 is linked to the gate of the first MOSFET 101 employed in the second variable-gain amplifier 122 whereas a connection point common to the capacitors 132 and 133 is linked to the gate of the second MOSFET 102 employed in the second variable-gain amplifier 122.

On the basis of the level of a signal output by the variable-gain amplification circuit 121 in accordance with the input signal, the AGC control circuit 140 generates the first gain control voltage E21 also serving as a signal for turning on or off the first variable-gain amplifier 121 in switching from one variable-gain amplifier to another, the first current-source control voltage Ec1 for controlling the current generated by the current-source MOSFET 105 employed in the first variable-gain amplifier 121 as well as the first gate bias voltage E11 applied to the gates of the first MOSFET 101 and the second MOSFET 102. By the same token, on the basis of the level of a signal output by the variable-gain amplification circuit 122 in accordance with the input signal, the AGC control circuit 140 generates the second gain control voltage E22 serving as a signal for turning on or off the second variable-gain amplifier 122 in switching from one variable-gain amplifier to another, the second current-source control voltage Ec2 for controlling the current generated by the current-source MOSFET 105 employed in the second variable-gain amplifier 122 as well as the second gate bias voltage E12 applied to the gates of the first MOSFET 101 and the second MOSFET 102.

In the typical configuration shown in FIG. 2, if the level of the input signal is within a range determined in advance, in general, only the first variable-gain amplifier 121 has to be subjected to the gain control. The predetermined range of the levels of the input signal is such a range that the first gain control voltage E21 satisfies condition equation 1 given earlier.

In the typical configuration shown in FIG. 2, as the level of the input signal goes beyond the range determined in advance, the first variable-gain amplifier 121 is turned off whereas the second variable-gain amplifier 122 is turned on in switching from one variable-gain amplifier to another.

Figure 3:
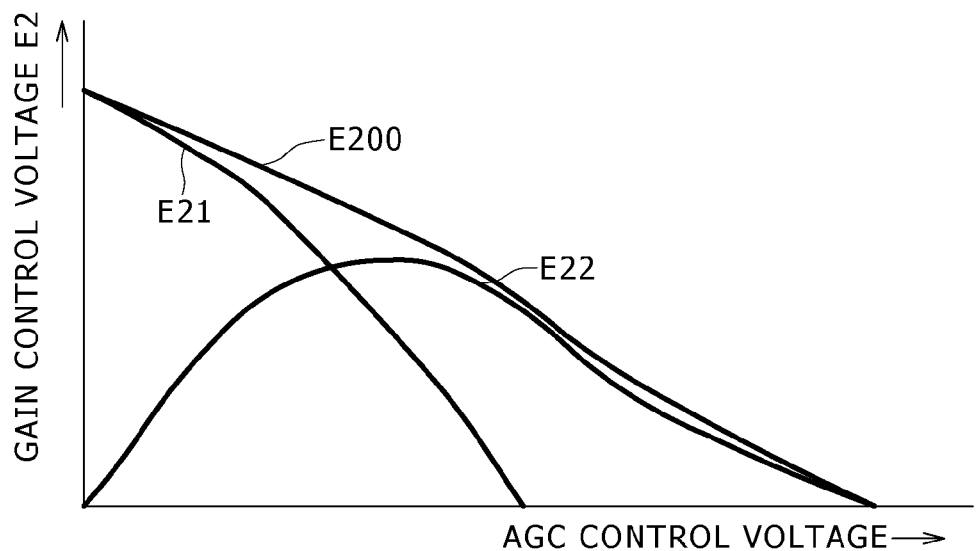
FIG. 3 is an explanatory diagram to be referred to in description of the embodiment shown in FIG. 2.

FIG. 3 is a diagram showing typical curves representing the first gain control voltage E21 supplied by the AGC control circuit 140 to the first variable-gain amplifier 121 and the second gain control voltage E22 supplied by the AGC control circuit 140 to the second variable-gain amplifier 122. The first current-source control voltage Ec1 supplied by the AGC control circuit 140 to the current-source MOSFET 105 employed in the first variable-gain amplifier 121 is controlled to rise in accordance with gain reduction control based on the first gain control voltage E21. By the same token, the second current-source control voltage Ec2 supplied by the AGC control circuit 140 to the current-source MOSFET 105 employed in the second variable-gain amplifier 122 is controlled to rise in accordance with gain reduction control based on the second gain control voltage E22.

Figure 4:
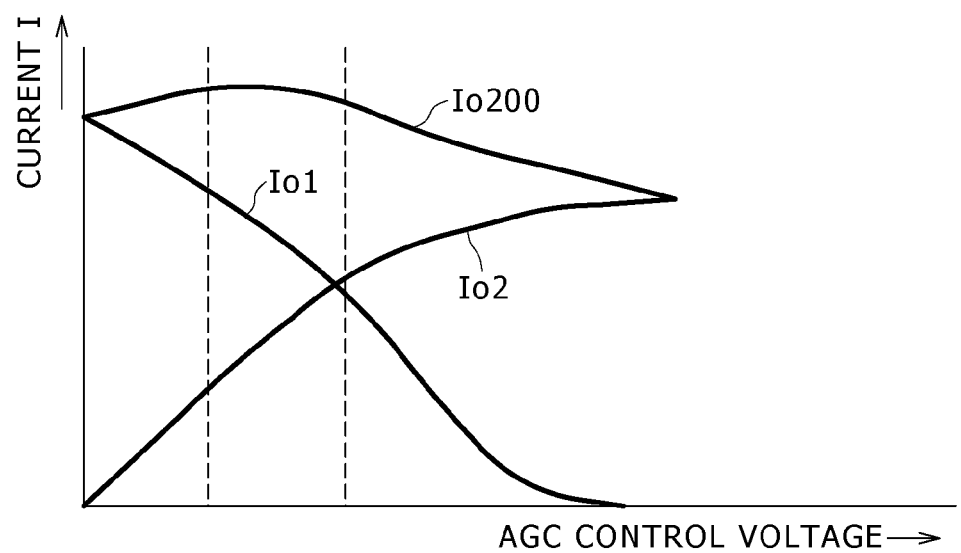
FIG. 4 is another explanatory diagram to be referred to in description of the embodiment shown in FIG. 2.

FIG. 4 is a diagram showing typical curves representing the currents Io1 and Io2 flowing through the current-source MOSFETs 105 employed in the first variable-gain amplifier 121 and second variable-gain amplifier 122.

It is to be noted that, the attenuation quantities of an attenuation circuit having the capacitors 131, 132 and 133 cited earlier are so determined by taking the range of changes of the level of the input signal into consideration that the maximum value of the range is covered. With satisfaction of condition equation 1 taken as a presumption, if the range of changes of the level of the input signal may not be covered, the number of stages can be increased to three or a larger integer in order to solve the problem.

In addition, in the typical configuration shown in FIG. 2, the output of the two-stage variable-gain amplification circuit 200 appears between output terminals OUT1 and OUT2 of a differential output (or a voltage output) of a feedback broadband amplifier at the output stage of the two-stage variable-gain amplification circuit 200.

To put it in detail, in the typical configuration shown in FIG. 2, one differential output of each of the first variable-gain amplifier 121 and the second variable-gain amplifier 122 is supplied to a first output amplifier 201. The differential output supplied to the first output amplifier 201 is an output appearing at the drain of the third MOSFET 103 employed in the first variable-gain amplifier 121 or the second variable-gain amplifier 122. The output of the first output amplifier 201 is supplied to the output terminal OUT1 of the differential output cited above. On the other hand, the other differential output of each of the first variable-gain amplifier 121 and the second variable-gain amplifier 122 is supplied to a second output amplifier 202. The other differential output supplied to the second output amplifier 202 is an output appearing at the drain of the fourth MOSFET 104 employed in the first variable-gain amplifier 121 or the second variable-gain amplifier 122. The output of the second output amplifier 202 is supplied to the output terminal OUT2 of the differential output cited above. Since the configuration of the first output amplifier 201 is completely identical with the configuration of the second output amplifier 202, in the following description, components employed in the second output amplifier 202 as components identical with their respective counterparts employed in the first output amplifier 201 are denoted by the same reference numerals as the counterparts.

In each of the first and second output amplifiers 201 and 202, the drain of a p-channel MOSFET 211 is connected to the drain of an n-channel MOSFET 212. The source of the p-channel MOSFET 211 is connected to the power-supply line of the voltage power supply +Vcc and the source of the n-channel MOSFET 212 is connected to the terminal of the ground. The p-channel MOSFET 211 and the n-channel MOSFET 212 are tied complementarily to each other in the so-called CMOS connection.

A connection point common to the drain of the p-channel MOSFET 211 and the drain of the n-channel MOSFET 212 is connected to the terminal of the ground through a series circuit having resistors 214 and 215 as well as the drain and source of a MOSFET 216. A connection point common to the resistors 214 and 215 is connected to the gate of the p-channel MOSFET 211. A connection point common to the drain of a MOSFET 216 and the resistor 215 is connected to the gate of the n-channel MOSFET 212.

Diode-connected MOSFETs 221 and 222 as well as a resistor 223 are connected to each other to form a series circuit between the power-supply line of the voltage power supply +Vcc and the terminal of the ground to form a current path. Forming a current source, the MOSFET 216 is provided in a current-mirror connection with respect to the current path. That is to say, the gate of the MOSFET 216 is connected to the gate of the diode-connected MOSFET 222.

One differential output obtained from the drain of the third MOSFETs 103 employed in the first variable-gain amplifier 121 and second variable-gain amplifier 122 is supplied to the gate of the MOSFET 211 employed in the first output amplifier 201 and to the gate of the MOSFET 212 also employed in the first output amplifier 201 by way of a capacitor 213. A connection point common to the drain of the MOSFET 211 and the drain of the MOSFET 212 is taken as one output terminal OUT1 of a differential output voltage.

By the same token, the other differential output obtained from the drain of the fourth MOSFETs 104 employed in the first variable-gain amplifier 121 and second variable-gain amplifier 122 is supplied to the gate of the MOSFET 211 employed in the second output amplifier 202 and to the gate of the MOSFET 212 also employed in the second output amplifier 202 by way of a capacitor 213. A connection point common to the drain of the MOSFET 211 and the drain of the MOSFET 212 is taken as the other output terminal OUT2 of the differential output voltage.

In addition, in the typical configuration shown in FIG. 2, the output terminal OUT1 in the first output amplifier 201 and the output terminal OUT2 in the second output amplifier 202 are connected to each other by resistors 224 and 225. A connection point common to the resistors 224 and 225 is connected to a common feedback circuit 150.

In the first variable-gain amplifier 121 included in the typical configuration shown in FIG. 2, the drain and source of a MOSFET 151 are connected between one differential output of the first variable-gain amplifier 121 and the power-supply line of the voltage power supply +Vcc. The MOSFET 151 is a p-channel MOSFET opposite to the channel of the MOSFETs 103 and 101, either of which is an n-channel MOSFET. In the second variable-gain amplifier 122 included in the typical configuration shown in FIG. 2, on the other hand, the drain and source of a MOSFET 152 are connected between the other differential output of the second variable-gain amplifier 122 and the power-supply line of the voltage power supply +Vcc. By the same token, the MOSFET 152 is a p-channel MOSFET opposite to the MOSFETs 104 and 102, either of which is an n-channel MOSFET.

The common feedback circuit 150 compares an electric potential appearing at a connection point common to the resistors 224 and 225 with a reference voltage determined in advance and supplies the result of the comparison to the gates of the p-channel MOSFETs 151 and 152 as a common feedback component.

The common feedback controls a current flowing through the p-channel MOSFET 151 to a magnitude equal to a current flowing through the third MOSFET 103 and the first MOSFET 101, which are employed in each of the first variable-gain amplifier 121 and the second variable-gain amplifier 122 respectively. The common feedback also controls a current flowing through the p-channel MOSFET 152 to a magnitude equal to a current flowing through the fourth MOSFET 104 and the second MOSFET 102, which are employed in each of the first variable-gain amplifier 121 and the second variable-gain amplifier 122 respectively. In this way, control is executed so that no DC current is generated as an output of the two-stage variable-gain amplification circuit 200.

As described above, the two-stage variable-gain amplification circuit 200 shown in FIG. 2 is capable of executing AGC in a wide range of input-signal levels while assuring that the number of generated distortions is small. In addition, as is obvious from FIG. 4, in accordance with this typical two-stage variable-gain amplification circuit 200, the operation current can be made a small consumed current without increasing the current to a magnitude several times the magnitude of a current flowing in a normal state as is the case with the variable-gain amplifier in the prior art.

<Second Typical Configuration>

Figure 5:
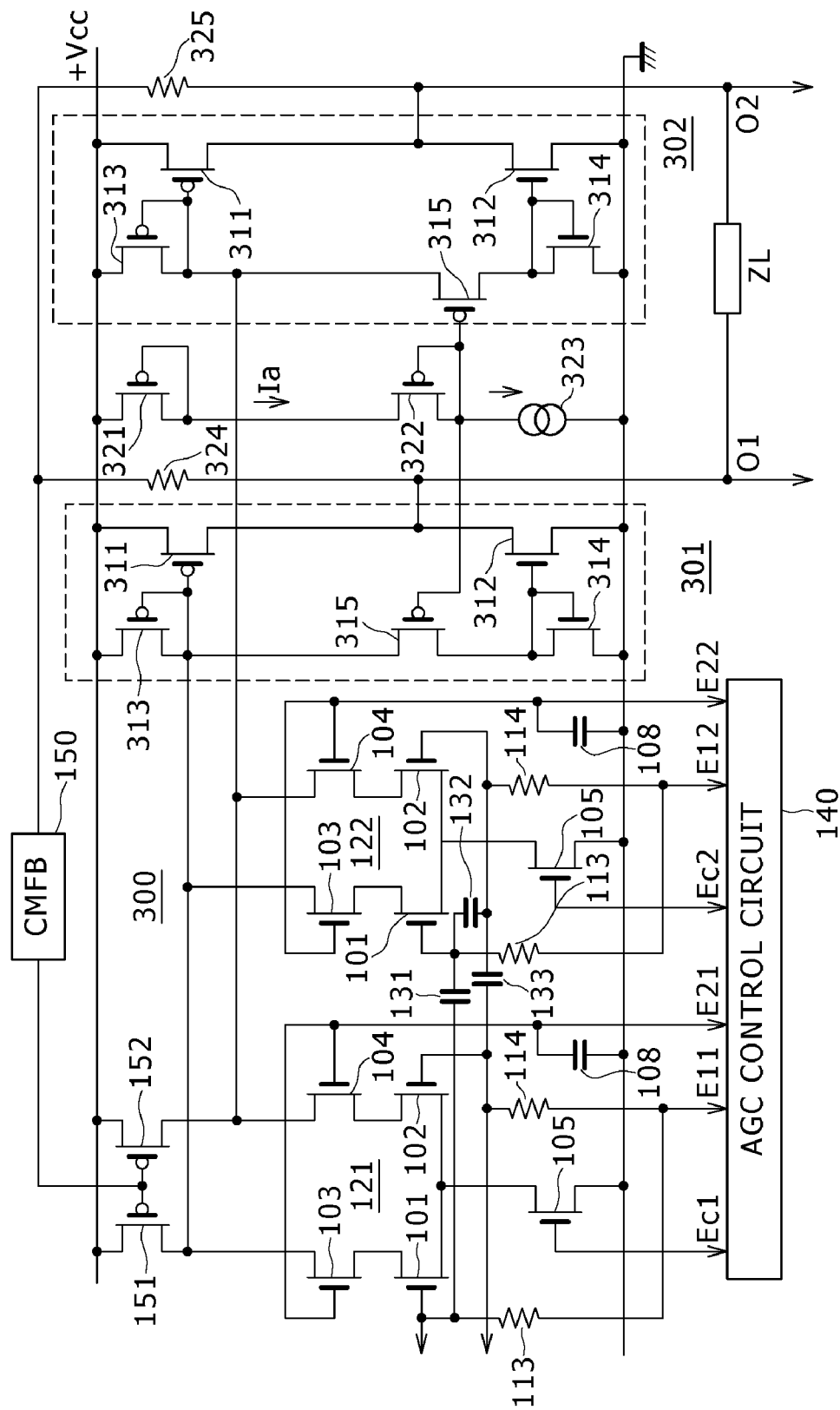
FIG. 5 is a diagram showing another typical configuration of another embodiment.

FIG. 5 is a diagram showing a second embodiment implementing a two-stage variable-gain amplification circuit 300 having a two-stage configuration. The two-stage variable-gain amplification circuit 300 according to the second embodiment includes the first variable-gain amplifier 121 and the second variable-gain amplifier 122, which each have a configuration completely identical with their respective counterparts employed in the first embodiment shown in FIG. 2. The two-stage variable-gain amplification circuit 300 also includes current amplification circuits 301 and 302 for amplifying the outputs of the first variable-gain amplifier 121 and the second variable-gain amplifier 122 respectively. In the typical configuration shown in FIG. 5, the current amplification circuits 301 and 302 generate a differential output between output terminals O1 and O2 connected to each other by a load ZL.

That is to say, in the typical configuration shown in FIG. 5, one differential output obtained from the drain of the third MOSFETs 103 employed in the first variable-gain amplifier 121 and the second variable-gain amplifier 122 is supplied to a current amplification circuit 301 serving as an output amplifier and the output of the current amplification circuit 301 is supplied to an output terminal O1 as one differential output.

By the same token, the other differential output obtained from the drain of the fourth MOSFETs 104 employed in the first variable-gain amplifier 121 and second variable-gain amplifier 122 is supplied to a current amplification circuit 302 also serving as an output amplifier and the output of the current amplification circuit 302 is supplied to an output terminal O2 as the other differential output.

Since the configuration of the current amplification circuit 301 is completely identical with the configuration of the current amplification circuit 302, in the following description, components employed in the current amplification circuit 302 as components identical with their respective counterparts employed in the current amplification circuit 301 are denoted by the same reference numerals as the counterparts.

In each of the current amplification circuits 301 and 302 included in the typical configuration shown in FIG. 5, the drain of a p-channel MOSFET 311 is connected to the drain of an n-channel MOSFET 312 in order to tie the p-channel MOSFET 311 and the n-channel MOSFET 312 complementarily to each other in the so-called CMOS connection. A connection point common to the drains of the p-channel MOSFET 311 and the n-channel MOSFET 312 is connected to the output terminal O1. The source of the p-channel MOSFET 311 is connected to the power-supply line of a voltage power supply +Vcc whereas the source of the n-channel MOSFET 312 is connected to a ground terminal.

In addition, a diode-connected p-channel MOSFET 313, a diode-connected n-channel MOSFET 314 and a p-channel MOSFET 315 form a series circuit connected between the power-supply line of a voltage power supply +Vcc and the terminal of the ground. The gate of the p-channel MOSFET 311 is connected to the gate of the p-channel MOSFET 313 so as to form a current-mirror circuit. By the same token, the gate of the n-channel MOSFET 312 is connected to the gate of the n-channel MOSFET 314 so as to form a current-mirror circuit.

In addition, in the configuration shown in FIG. 5, a diode-connected MOSFET 321, a diode-connected MOSFET 322 and a current source 323 form a series circuit connected between the power-supply line of a voltage power supply +Vcc and the terminal of the ground. This series circuit flows a reference current Ia, generating a voltage that determines a reference current flowing through the p-channel MOSFET 313 and the p-channel MOSFET 315.

A connection point common to the drain and gate of the diode-connected MOSFET 322 is connected to the gates of the MOSFETs 315 employed in the current amplification circuits 301 and 302 to form a current-mirror configuration.

One differential output generated by the first variable-gain amplifier 121 and the second variable-gain amplifier 122 is supplied to the gate of the p-channel MOSFET 311 employed in the current amplification circuit 301 whereas the other differential output generated by the first variable-gain amplifier 121 and the second variable-gain amplifier 122 is supplied to the gate of the p-channel MOSFET 311 employed in the current amplification circuit 302.

In addition, in the typical configuration shown in FIG. 5, the output terminal O1 of the current amplification circuit 301 and the output terminal O2 of the current amplification circuit 302 are connected to a common feedback circuit 150 through resistors 324 and 325 respectively. A connection point common to the resistors 324 and 325 is connected to the common feedback circuit 150, which serves as a common feedback component. In this feedback configuration, the common feedback controls a current flowing through the p-channel MOSFET 151 to a magnitude equal to a current flowing through the third MOSFET 103 and the first MOSFET 101, which are employed in the first variable-gain amplifier 121. The common feedback also controls a current flowing through the p-channel MOSFET 152 to a magnitude equal to a current flowing through the fourth MOSFET 104 and the second MOSFET 102, which are employed in the second variable-gain amplifier 122. In this way, control is executed so that no DC current is generated as an output of the two-stage variable-gain amplification circuit 300.

The two-stage variable-gain amplification circuit 300 having the typical configuration shown in FIG. 5 is typically used as a high-frequency amplification circuit employed in a front-end circuit of a TV tuner as an amplification circuit having an AGC function. Typically, a tuning circuit including an inductor L and a capacitor C is connected between the output terminals O1 and O2, at which a voltage output by the two-stage variable-gain amplification circuit 300 appears and is applied to the tuning circuit.

<Third Typical Configuration>

Figure 6:
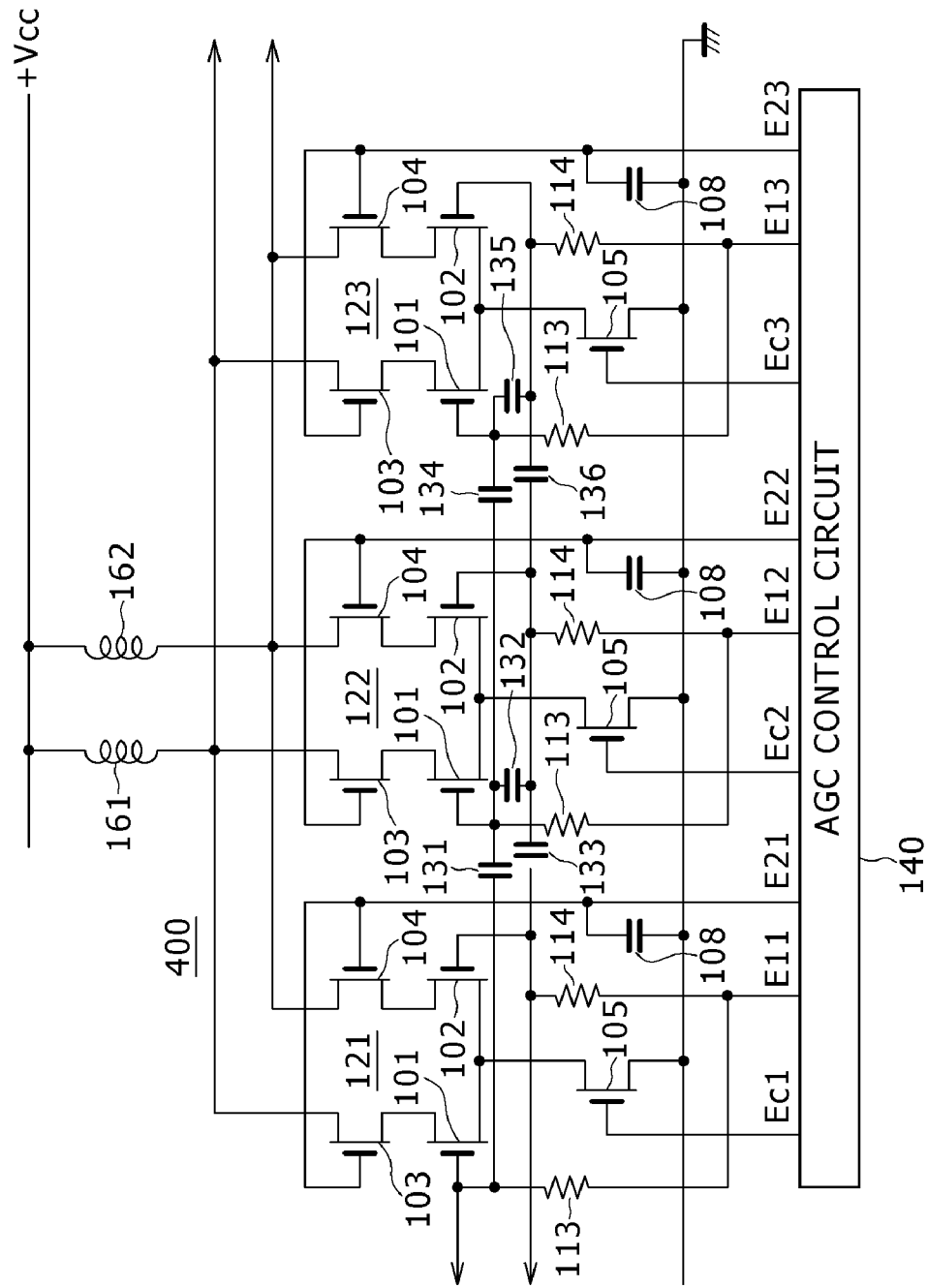
FIG. 6 is a diagram showing another typical configuration of an embodiment.

In the configuration of a third embodiment shown in FIG. 6, three variable-gain amplification circuits 100 each shown in FIG. 1 are provided at three stages respectively and connected to each other to form a three-stage variable amplification circuit 400. In this typical configuration, the levels of input signals supplied to the variable-gain amplification circuits at the second and third stages are each a level obtained by attenuating the level of an input signal supplied to a variable-gain amplification circuit at the immediately preceding stage. In the third embodiment, a variable-gain amplification circuit at a specific stage is turned on when a variable-gain amplification circuit at the stage immediately preceding the specific stage is turned off in switching from one variable-gain amplifier to another. In addition, in the third embodiment, the variable-gain amplification circuit at the third stage is directly connected to a load not through an output amplifier such as a voltage or current amplifier.

As described above, in the third embodiment shown in FIG. 6, a first variable-gain amplifier 121, a second variable-gain amplifier 122 and a third variable-gain amplifier 123 at the first, second and third stages respectively each have a configuration identical with that of the single-stage variable-gain amplification circuit 100 shown in FIG. 1 and carry out operations similar to those of the single-stage variable-gain amplification circuit 100. In addition, one differential output of the drains of the third MOSFETs 103 employed in the first variable-gain amplifier 121, the second variable-gain amplifier 122 and the third variable-gain amplifier 123 at the first, second and third stages respectively is supplied to one output terminal connected directly to a coil 161 working as a load. On the other hand, the other differential output of the drains of the fourth MOSFETs 104 employed in the first variable-gain amplifier 121, the second variable-gain amplifier 122 and the third variable-gain amplifier 123 is supplied to another output terminal connected directly to a coil 162 working as a load.

An AGC circuit 140 employed in the three-stage variable-gain amplification circuit 400 according to the third embodiment supplies gain control voltages E21, E22 and E23 to the first variable-gain amplifier 121, the second variable-gain amplifier 122 and the third variable-gain amplifier 123 at the first, second and third stages respectively in accordance with signals output by the three-stage variable-gain amplification circuit 400. The AGC control circuit 140 also supplies gate bias voltages E11, E12 and E13 to the first variable-gain amplifier 121, the second variable-gain amplifier 122 and the third variable-gain amplifier 123 at the first, second and third stages respectively in accordance with signals output by the three-stage variable-gain amplification circuit 400. In addition, the AGC control circuit 140 also supplies current-source control voltages Ec1, Ec2 and Ec3 to the gates of the current-source MOSFETs 105 employed in the first variable-gain amplifier 121, the second variable-gain amplifier 122 and the third variable-gain amplifier 123 at the first, second and third stages respectively in accordance with signals output by the three-stage variable-gain amplification circuit 400.

The first current-source control voltage Ec1 supplied to the gate of the current-source MOSFET 105 employed in the first variable-gain amplifier 121 at the first stage determines a current Io1 flowing through the current-source MOSFET 105. By the same token, the second current-source control voltage Ec2 supplied to the gate of the current-source MOSFET 105 employed in the second variable-gain amplifier 122 at the second stage determines a current Io2 flowing through the current-source MOSFET 105. In the same way, the second current-source control voltage Ec2 supplied to the gate of the current-source MOSFET 105 employed in the third variable-gain amplifier 123 at the third stage determines a current Io3 flowing through the current-source MOSFET 105. Thus, the first current-source control voltage Ec1, the second current-source control voltage Ec2 and the third current-source control voltage Ec3 also function as signals for turning on or off the first variable-gain amplifier 121, the second variable-gain amplifier 122 and the third variable-gain amplifier 123 respectively in switching from one variable-gain amplifier to another.

In the typical configuration shown in FIG. 6, the input signal is supplied to the gates of the first and second MOSFETs 101 and 102 employed in the first variable-gain amplifier 121 as it is without being attenuated. However, the input signal is divided by capacitors 131, 132 and 133 serving as an attenuator for attenuating the input signal before being supplied to the gates of the first and second MOSFETs 101 and 102 employed in the second variable-gain amplifier 122 in the same way as the two-stage variable-gain amplification circuit 300 according to the second embodiment shown in FIG. 5.

In addition, in the typical configuration shown in FIG. 6, capacitors 134, 135 and 136 form a series circuit. One end of the series circuit is connected to a connection point common to the capacitors 131 and 132 whereas the other end of the series circuit is connected to a connection point common to the capacitors 132 and 133. A connection point common to the capacitors 134 and 135 is connected to the gate of the first MOSFET 101 employed in the third variable-gain amplifier 123. On the other hand, a connection point common to the capacitors 135 and 136 is connected to the gate of the second MOSFET 102 employed in the third variable-gain amplifier 123.

On the basis of the level of a signal output by the variable-gain amplification circuit 121 in accordance with the input signal, the AGC control circuit 140 generates the first gain control voltage E21 serving as a signal for turning on or off the first variable-gain amplifier 121 in switching from one variable-gain amplifier to another, the first current-source control voltage Ec1 for controlling the current and thus also serving as a signal for turning on or off the first variable-gain amplifier 121 in switching from one variable-gain amplifier to another as described above as well as the first gate bias voltage E11 applied to the gates of the first MOSFET 101 and the second MOSFET 102. By the same token, on the basis of the level of a signal output by the variable-gain amplification circuit 122 in accordance with the input signal, the AGC control circuit 140 generates the second gain control voltage E22 serving as a signal for turning on or off the second variable-gain amplifier 122 in switching from one variable-gain amplifier to another, the second current-source control voltage Ec2 for controlling the current and thus also serving as a signal for turning on or off the second variable-gain amplifier 122 in switching from one variable-gain amplifier to another as described above as well as the second gate bias voltage E12 applied to the gates of the first MOSFET 101 and the second MOSFET 102. In the same way, on the basis of the level of a signal output by the variable-gain amplification circuit 123 in accordance with the input signal, the AGC control circuit 140 generates the third gain control voltage E23 serving as a signal for turning on or off the third variable-gain amplifier 123 in switching from one variable-gain amplifier to another, the third current-source control voltage Ec3 for controlling the current and thus also serving as a signal for turning on or off the third variable-gain amplifier 123 in switching from one variable-gain amplifier to another as described above as well as the third gate bias voltage E13 applied to the gates of the first MOSFET 101 and the second MOSFET 102.

In the three-stage variable-gain amplification circuit 400 according to the third embodiment shown in FIG. 6, for an input signal level not exceeding a predetermined threshold Eth1, only the first variable-gain amplifier 121 has to be operated and the gain of the first variable-gain amplifier 121 is fixed. For an input signal level exceeding the predetermined threshold Eth1, however, the first gain control voltage E21 controls the first variable-gain amplifier 121 to reduce its gain. This control is executed by raising the first gate bias voltage E11 as described earlier.

For an input signal level exceeding a predetermined threshold Eth2 greater than the threshold Eth1 determined in advance, the gain control voltages E21 and E22 as well as the current-source control voltages Ec1 and Ec2 are adjusted in order to execute gain control to turn off the first variable-gain amplifier 121 and turn on the second variable-gain amplifier 122 in switching from one variable-gain amplifier to another.

For an input signal level exceeding a predetermined threshold Eth3 even greater than the threshold Eth2 determined in advance, the gain control voltages E22 and E23 as well as the current-source control voltages Ec2 and Ec3 are adjusted in order to execute gain control to turn off the second variable-gain amplifier 122 and turn on the third variable-gain amplifier 123 in switching from one variable-gain amplifier to another.

As described above, with the three-stage variable-gain amplification circuit 400 according to the third embodiment, the range of input signal levels that can be tolerated can be widened to a value greater than the ranges provided by the first and second embodiments.

Concrete Circuits Implementing the Variable-Gain Amplification Circuits According to the Embodiments The variable-gain amplification circuit provided by the present invention can be used as a high-frequency amplification circuit of a tuner section (or a front-end circuit) for receiving TV signals. In particular, a recent conceivable TV tuner allows the channel to be switched from one to another over a wide range of channels. The variable-gain amplification circuit provided by the present invention can be used as a high-frequency amplification circuit of a tuner section allowing the channel to be switched from one to another over a wide range of channels.

Frequencies (or channels) used in TV broadcasting vary from country to country. On top of that, there are also a variety of color systems such as the NTSC, the PAL and the SECAM. In addition, there are also analog broadcasting and digital broadcasting.

In order to deal with various kinds of TV broadcasting described above, a system for receiving TV broadcasting signals can be conceivably divided into a front-end circuit and a base-band processing circuit. The front-end circuit is a circuit for receiving a TV broadcast and outputting an intermediate-frequency signal. On the other hand, the base-band processing circuit is a circuit processing the intermediate-frequency signal output by the front-end circuit in order to generate a color video signal and an audio signal. By dividing a system for receiving TV broadcasting signals into a front-end circuit and a base-band processing circuit as described above, it is possible to cope with different TV broadcasting systems.

With a system for receiving TV broadcasting signals divided into a front-end circuit and a base-band processing circuit, first of all, the following description explains a typical front-end circuit. The typical front-end circuit is an integrated circuit designed to reduce the number of components.

[Typical Front-End Circuit of a TV Tuner]

Figure 7:
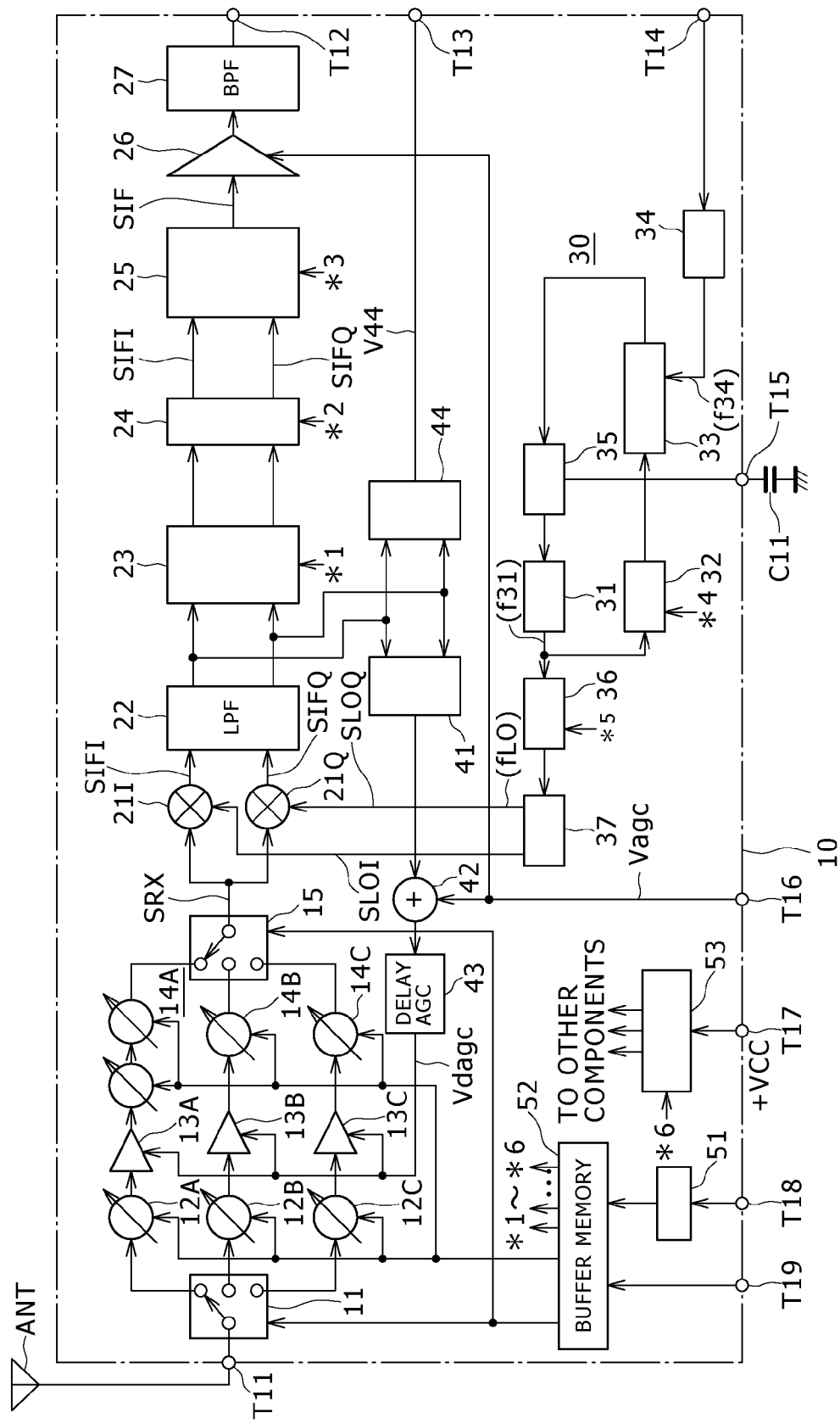
FIG. 7 is an explanatory diagram showing a typical configuration of a TV tuner employing a variable-gain amplification circuit according to an embodiment of the present invention.

FIG. 7 is a diagram showing a typical front-end circuit capable of receiving TV broadcasts of different countries without regard to the broadcasting systems. In this typical front-end circuit, frequencies used for transmitting the terminal pin TV broadcasts of different countries are divided into the following three bands:

(A): VL band ranging from 46 MHz to 147 MHz
(B): VH band ranging from 147 MHz to 401 MHz
(C): U band ranging from 401 MHz to 887 MHz Each of the frequency bands can be selected as a band including a frequency corresponding to a desired channel.

A portion 10 enclosed by a dashed line in FIG. 7 is the front-end circuit, which is integrated into a single-chip IC. The chip of the front-end IC 10 has terminal pins T11 to T19 for connecting the front-end IC 10 to external devices.

An antenna ANT connected to the terminal pin T11 receives a wave signal of a TV broadcast, supplying the signal to a selected specific one of antenna tuning circuits 12A to 12C through a switch circuit 11 for selecting the specific tuning circuit. The antenna tuning circuits 12A to 12C correspond to the above three bands (A) to (C) respectively. The antenna tuning circuits 12A to 12C each include a tuning capacitor, the capacitance of which can be changed in accordance with digital data to vary the tuning frequency of the circuit. The tuning frequency is changed to the frequency of a desired channel in order to put the selected one of the antenna tuning circuits 12A to 12C in a state tuned for the channel.

A signal output by the selected one of the antenna tuning circuits 12A to 12C is supplied to a switch circuit 15 by way of a selected one of high-frequency amplification circuits 13A to 13C and a selected one of inter-stage tuning circuits 14A to 14C. The state of the switch circuit 15 is switched from one to another in a manner interlocked with the state of the switch circuit 11. Thus, a signal SRX of a desired frequency band can be obtained from the switch circuit 15. Then, the signal SRX obtained from the switch circuit 15 is supplied to mixer circuits 12I and 12Q.

It is to be noted that each of the inter-stage tuning circuits 14A to 14C has a configuration identical with the configuration of each of the antenna tuning circuits 12A to 12C. Unlike the inter-stage tuning circuits 14B and 14C, however, the inter-stage tuning circuit 14A is a double tuning circuit. In addition, as will be described later, each of the tuning circuits 12A to 12C and 14A to 14C has a tuning capacitor embedded in the IC 10 but an external tuning coil attached to the IC 10.

A VCO (Voltage-Controlled Oscillator) 31 generates an oscillation signal having a frequency determined in advance. The oscillation signal generated by the VCO 31 is a local oscillation signal. The VCO 31 is a component employed in a PLL circuit 30. In the PLL circuit 30, the local oscillation signal generated by the VCO 31 is supplied to a variable frequency-division circuit 32 for generating a divided-frequency signal having a frequency equal to 1/N times the frequency of the local oscillation signal, where N is a positive integer representing a frequency division rate. The variable frequency-division circuit 32 supplies the divided-frequency signal to a phase comparison circuit 33. A clock signal having a frequency in the range 1 to 2 MHz is supplied by an external source to a signal formation circuit 34 by way of the terminal pin T14. The signal formation circuit 34 divides the frequency of the clock signal in order to generate predetermined divided-frequency signal f34 and supplies this other divided-frequency signal to the phase comparison circuit 33 as a reference signal.

The phase comparison circuit 33 compares the phase of the divided-frequency signal received from the variable frequency-division circuit 32 with the phase of the other divided-frequency signal received from the signal formation circuit 34 in order to generate a comparison result representing the difference in phase between the divided-frequency signal received from the variable frequency-division circuit 32 with the other divided-frequency signal received from the signal formation circuit 34, supplying the result of the comparison to a loop filter 35 for outputting a DC voltage with a level varying in accordance with the difference in phase to the VCO 31. The loop filter 35 supplies the DC voltage to the VCO 31 as a voltage for controlling the VCO 31 to generate an oscillation signal with an oscillation frequency f31. It is to be noted that the loop filter 35 is connected to the terminal pin T15 to which an external capacitor C11 is wired.

Thus, the oscillation frequency f31 of the oscillation signal generated by the VCO 31 is expressed by the following equation.

$$f31 = N \cdot f34 \qquad (\text{Eq. 2})$$

The above equation suggests that, by letting a microcomputer (not shown) serving as a system controller control the frequency division rate N, the oscillation frequency f31 of the oscillation signal generated by the VCO 31 can be changed. Selected in accordance with the frequency band and the frequency of a desired channel, the oscillation frequency f31 is typically a frequency in the range 1.8 to 3.6 GHz.

The VCO 31 supplies the oscillation signal to a variable frequency-division circuit 36 for dividing the oscillation frequency of the frequency signal by multiplying the frequency by 1/M where, typically, (M=2, 4, 8, 16 or 32). The variable frequency-division circuit 36 supplies a divided-frequency signal with a frequency equal to 1/M times the oscillation frequency to a frequency-division circuit 37 for dividing the frequency of the divided-frequency signal by multiplying the frequency by ½. The frequency-division circuit 37 also splits the divided-frequency signal received from the variable frequency-division circuit 36 into divided-frequency signals SL0I and SL0Q having phases orthogonal to each other. The frequency-division circuit 37 supplies the divided-frequency signals SL0I and SL0Q to the mixer circuits 21I and 21Q as local oscillation signals.

Let notation fL0 denote the local oscillation frequency of the divided-frequency signals SL0I and SL0Q. The local oscillation frequency fL0 is expressed by the following equation:

$$fL0 = f31/2M$$
$$= N \cdot f34/2M$$
$$= f34 \cdot N/2M \qquad (\text{Eq. 3})$$

Thus, by changing the frequency division rates N and M, the local oscillation frequency fL0 can be varied to frequencies determined in advance as frequencies included in a wide range.

Let notations SRX and SUD denote a desired received signal and an image disturbance signal respectively. For the sake of simplicity, the desired received signal SRX is expressed as follows:

$$SRX = ERX \cdot \sin \omega RXt$$

where notation ERX denotes the amplitude of the desired received signal SRX and the following equation holds true:

$$\omega RX = 2\pi fRX$$

where notation fRX denotes the center frequency of the desired received signal SRX.

On the other hand, the image disturbance signal SUD is expressed as follows:

$$SUD = EUD \cdot \sin \omega UDt$$

where notations EUD denotes the amplitude of the image disturbance signal SUD and the following equation holds true:

$$\omega UD = 2\pi fUD$$

where notation fUD denotes the center frequency of the image disturbance signal SUD.

In addition, the local oscillation signals SL0I and SL0Q are expressed as follows:

$$SL0I = EL0 \cdot \sin \omega L0t$$
$$SL0Q = EL0 \cdot \cos \omega L0t$$

where notation EL0 denotes the amplitude of the local oscillation signals SL0I and SL0Q and the following equation holds true:

$$\omega L0 = 2\pi fL0$$

In this case, however, the following equation holds true:

$$\omega IF = 2\pi fIF$$

where notation fIF denotes a center frequency typically in the range 4 to 5.5 MHz, which changes in accordance with the broadcasting method. In the case of an upper heterodyne system, the center frequency fRX of the desired received signal SRX and the center frequency fUD of the image disturbance signal SUD are expressed as follows:

$$fRX = fL0 - fIF$$

$$fUD = fL0 + fIF$$

Thus, the mixer circuits 21I and 21Q output respectively signals SIFI and SIFQ, which can be expressed as follows:

$$SIFI = (SRX + SUD) \times SL0I$$

$$= ERX \cdot \sin \omega RXt \times EL0 \cdot \sin \omega L0t + EUD \cdot \sin \omega UDt \times EL0 \cdot \sin \omega L0t$$

$$= \alpha \{ \cos(\omega RX - \omega L0)t - \cos(\omega RX + \omega L0)t \} + \beta \{ \cos(\omega UD - \omega L0)t - \cos(\omega UD + \omega L0)t \}$$

$$SIFQ = (SRX + SUD) \times SL0Q$$

$$= ERX \cdot \sin \omega RXt \times EL0 \cdot \cos \omega L0t + EUD \cdot \sin \omega UDt \times EL0 \cdot \cos \omega L0t$$

$$= \alpha \{ \sin(\omega RX + \omega L0)t + \sin(\omega RX - \omega L0)t \} + \beta \{ \sin(\omega UD + \omega L0)t + \sin(\omega UD - \omega L0)t \}$$

Notations $\alpha$ and $\beta$ used in the above equations satisfy the following equations:

$$\alpha = ERX \cdot EL0/2$$

$$\beta = EUD \cdot EL0/2$$

Then, the mixer circuits 21I and 21Q supply the signals SIFI and SIFQ respectively to a broad-band low-pass filter 22. The broad-band low-pass filter 22 has a band broader than the band occupied by a video intermediate-frequency signal and an audio intermediate-frequency signal. The band occupied by a video intermediate-frequency signal and an audio intermediate-frequency signal is typically 6 to 8 MHz. The broad-band low-pass filter 22 excludes signal components having the sum angular frequencies ($\omega RX + \omega L0$) and ($\omega UD + \omega L0$) as well as the local oscillation signals SL0I and SL0Q. As a result, the broad-band low-pass filter 22 outputs signals SIFI and SIFQ, which are expressed as follows:

$$SIFI = \alpha \cdot \cos(\omega RX - \omega L0)t + \beta \cdot \cos(\omega UD - \omega L0)t = \alpha \cdot \cos \omega IFt + \beta \cdot \cos \omega IFt \quad \text{(Eq. 4)}$$

$$SIFQ = \alpha \cdot \sin(\omega RX - \omega L0)t + \beta \cdot \sin(\omega UD - \omega L0)t = -\alpha \cdot \sin \omega IFt + \beta \cdot \sin \omega IFt \quad \text{(Eq. 5)}$$

The broad-band low-pass filter 22 supplies the signals SIFI and SIFQ to a poly-phase band-pass filter 24 by way of an amplitude/phase correction circuit 23 to be described later. The poly-phase band filter 24 has characteristics described as follows:

(a): The poly-phase band filter 24 has the frequency characteristic of a band-pass filter.

(b): The poly-phase band filter 24 also has a phase shifting characteristic. As a matter of fact, the poly-phase band filter 24 shifts the phase of the signal SIFI by a phase displacement $\phi$ where $\phi$ is an arbitrary value.

(c): By the same token, the poly-phase band filter 24 shifts the phase of the signal SIFQ by a phase displacement of ($\phi - 90°$).

(d): The poly-phase band filter 24 also has two band-pass characteristics symmetrical with respect to the frequency of 0. One of the two band-pass characteristics has a center frequency f0 whereas the other band-pass characteristic has a center frequency −f0. The poly-phase band filter 24 selects one of the two band-pass characteristics in accordance with the phase of the input signal.

As described in the above statements (b) and (c), the poly-phase band filter 24 delays the phase of the signal SIFQ from the phase of the signal SIFI by 90° to result in:

$$SIFI = \alpha \cdot \cos \omega IFt + \beta \cdot \cos \omega IFt \quad \text{(Eq. 6)}$$

$$SIFQ = -\alpha \cdot \sin(\omega IFt - 90°) + \beta \cdot \sin(\omega IFt - 90°) = \alpha \cdot \cos \omega IFt - \beta \cdot \cos \omega IFt \quad \text{(Eq. 7)}$$

As obvious from the above equations, a component $\alpha \cdot \cos \omega IFt$ included in the signal SIFQ has the same phase as a component $\alpha \cdot \cos \omega IFt$ included the signal SIFI. However, a $\beta \cdot \cos \omega IFt$ included in the signal SIFQ has a phase opposite to the phase of a $\beta \cdot \cos \omega IFt$ included the signal SIFI.

The poly-phase band filter 24 supplies the signals SIFI and SIFQ to a level correction amplifier 25 for adding the signal SIFI to the signal SIFQ in order to generate a signal SIF, which is expressed by the following equation:

$$SIF = SIFI + SIFQ = 2\alpha \cdot \cos \omega IFt = ERX \cdot EL0 \cdot \cos \omega IFt \quad \text{(Eq. 8)}$$

This signal SIF is no other than the intermediate-frequency signal of a signal SRX received by adoption of the upper heterodyne system. The signal SIF does not include an image disturbance signal SUD. It is to be noted that the amplitude/phase correction circuit 23 corrects the amplitude and phase of the signals SIFI and SIFQ so that Eq. (8) fully holds true, that is, the image disturbance signal SUD is minimized.

In addition, at that time, the level correction amplifier 25 corrects the level of the signal SIF so that an AGC characteristic to be described later (in particular, an AGC start level) and the like do not change even if the levels of the signals SIFI and SIFQ change in accordance with the adopted broadcasting system.

The level correction amplifier 25 supplies the signal SIF to the terminal pin T12 by way of a AGC variable-gain amplifier 26 and a band-pass filter 27 for eliminating a DC component and for aliasing.

Thus, by changing the frequency division rates M and N, the frequency of a desired channel can be selected as a frequency determined by the frequency division rates M and N in accordance with Eq. (3). In addition, by demodulating the intermediate-frequency signal SIF output to the terminal pin T12 in accordance with the adopted broadcasting system, the desired broadcast can be watched and listened to.

As obvious from the above description, the front-end circuit 10 capable of coping with signals having frequencies in a wide range of 46 to 887 MHz can be put in a single-chip IC. In addition, the front-end IC 10 can be implemented by making use of smaller number of components without deteriorating the characteristic capability of dealing with image disturbance signals over a wide frequency range. On top of that, one front-end circuit 10 is capable of dealing with differences between analog and digital broadcasting systems and differences in broadcasting system between regions in the whole world.

In addition, the number of received-signal disturbances caused by harmonics of a clock signal can be reduced so that, as a result, the signal receiving sensitivity can be improved. On top of that, except the capacitor C11, all the components of the PLL 30 can be embedded in the chip of the front-end circuit 10. Thus, the PLL 30 can be made to protect against external disturbances so that the effect of disturbances can be reduced. In addition, since the high-frequency amplification circuits 13A to 13C are connected to the inter-stage tuning circuits 14A to 14C respectively, the borne load is reduced and the high-frequency amplification circuits 13A to 13C can each be made a circuit generating small distortions.

(Typical AGC)

An AGC voltage Vagc is generated by a base-band processing circuit provided at a stage following the front-end circuit 10. The base-band processing circuit itself is shown in none of the figures. The base-band processing circuit supplies the AGC voltage Vagc to the AGC variable-gain amplifier 26 by way of the terminal pin T16 as a signal for automatically controlling the gain of the AGC variable-gain amplifier 26. Thus, it is possible to execute the ordinary AGC (that is, the AGC of the intermediate-frequency signal SIF).

In addition, for example, if the level of a desired received signal SRX is too high or if a disturbance wave signal having a high level is mixed with the desired received signal SRX, such a signal SRX and such a disturbance wave signal may not be coped with by execution of the normal AGC. In order to solve this problem, the broad-band low-pass filter 22 also supplies the signals SIFI and SIFQ to a level detection circuit 41 for generating a detection signal indicating whether or not the levels of the signals SIFI and SIFQ prior to execution of the AGC by the AGC variable-gain amplifier 26 are higher than their respective thresholds determined in advance. The level detection circuit 41 supplies a detection signal to an adder 42 for adding the detection signal to the AGC voltage Vagc supplied to the adder 42 by way of the terminal pin T16. The adder 42 supplies the sum of the detection signal and the AGC voltage Vagc to a delay AGC voltage formation circuit 43 for generating a delayed AGC voltage Vdagc. The delay AGC voltage formation circuit 43 supplies the delayed AGC voltage Vdagc to the high-frequency amplification circuits 13A to 13C as a control signal. In this way, delayed AGC is executed.

Let a D/U ratio defined as a ratio of the strength of a desired received signal to the strength of undesired received signals. Thus, since an optimum AGC operation based on the D/U ratio can be carried out, a desired broadcast can be received well in digital or analog broadcasting or mixed digital/analog broadcasting.

(Typical Test and Adjustment Voltages)

The broad-band low-pass filter 22 also supplies the signals SIFI and SIFQ to a linear detection circuit 44 for detecting and smoothing the signals SIFI and SIFQ. The linear detection circuit 44 generates a DC voltage V44 representing the levels of the signals SIFI and SIFQ, supplying the detection voltage V44 to the terminal pin T13.

The detection voltage V44 supplied to the terminal pin T13 is used typically for testing and adjusting the front-end circuit 10. For example, the detection voltage V44 supplied to the terminal pin T13 can be used for checking the front-end circuit 10 receiving input signals with different levels and frequencies spread over a wide range. In this way, unlike an output generated through an intermediate-frequency filter having a narrow band, it is possible to check the attenuation characteristic over a broad band for signal lines ranging from the input signal supplied to the terminal pin T11 to signals generated by the mixer circuits 21I and 21Q.

In addition, in an operation to adjust the antenna tuning circuits 12A to 12C and the inter-stage tuning circuits 14A to 14C, an input test signal is supplied to the terminal pin T11 and the AGC voltage Vagc supplied to the terminal pin T16 is kept at a constant level. In this way, tracking adjustment (or adjustment of the tuning frequency) can be carried out from changes in detection voltage V44. On top of that, by using digital data, functions of the front-end circuit 10 can be adjusted and characteristics of the front-end circuit 10 can be measured so that the adjustment and the measurement can be carried out automatically.

(Constant-Voltage Circuit)

The front-end circuit 10 is also provided with a constant-voltage circuit 53 receiving a power-supply voltage +VCC from the terminal pin T17. The constant-voltage circuit 53 is a component for generating a constant voltage having a level determined in advance from the power-supply voltage +VCC by making use of a band gap of PN junction. The constant-voltage circuit 53 supplies the generated constant voltage to a variety of circuits employed in the front-end circuit 10. It is to be noted that, in this embodiment, the constant voltage generated by the constant-voltage circuit 53 can be adjusted finely.

Thus, if the circuits employed in the front-end circuit 10 are each made from MOSFETs, the constant voltage generated by the constant-voltage circuit 53 can be made slightly higher than its normal level so that the most of the performance of the MOSFETs can be displayed.

(Initial Setting)

The correction quantity of the amplitude/phase correction circuit 23, the center frequency and passing bandwidth of the poly-phase band filter 24 as well as the gain of the level correction amplifier 25 has to be compatible with the broadcasting system of the received TV broadcasts. That is to say, the correction quantity of the amplitude/phase correction circuit 23, the center frequency and passing bandwidth of the poly-phase band filter 24 as well as the gain of the level correction amplifier 25 have to be adjustable and can be set externally. For example, the center frequency of the poly-phase band filter 24 can be changed to any value in the range 3.8 to 5.5 MHz whereas the passing bandwidth of the poly-phase band filter 24 can be changed to any value in the range 5.7 to 8 MHz.

Then, when the front-end circuit 10 is assembled at the factory or the front-end circuit 10 is shipped from the factory, the setting values of the amplitude/phase correction circuit 23, the poly-phase band filter 24 and the level correction amplifier 25 are written into a non-volatile memory 51 by way of the terminal pin T18. In addition, tracking data of the antenna tuning circuits 12A to 12C and the inter-stage tuning circuits 14A to 14C as well as data used for finely adjusting the voltage output by the constant-voltage circuit 53 are also written into the non-volatile memory 51 by way of the terminal pin T18. The tracking data is data used for adjusting the tuning frequency. In this way, the correction quantity of the amplitude/phase correction circuit 23, the center frequency and passing bandwidth of the poly-phase band filter 24 as well as the gain of the level correction amplifier 25 can be made compatible with the broadcasting system of the received TV broadcasts.

(Operations to Use the Circuit 10)

When the power supply of a receiver employing the front-end circuit 10 is turned on, the setting values stored in the non-volatile memory 51 are copied to a buffer memory 52. As default values, the copied data is transferred from the buffer memory 52 to the antenna tuning circuits 12A to 12C, the inter-stage tuning circuits 14A to 14C, components ranging from the amplitude/phase correction circuit 23 to the level correction amplifier 25 and the constant-voltage circuit 53.

Then, when the user selects a channel, the microcomputer transfers data for the selected channel to the buffer memory 52 used for temporarily storing the data by way of the terminal pin T19. Serving as a system controller, the microcomputer itself is shown in none of the figures. The data is then supplied to the switch circuits 11 and 15, the antenna tuning circuits 12A to 12C, the inter-stage tuning circuits 14A to 14C, the variable frequency-division circuit 32 as well as the variable frequency-division circuit 36 in order to select a frequency band including the frequency of a desired channel and select the desired channel.

Features of the Front-End Circuit According to the Embodiment

In accordance with the front-end circuit 10 shown in FIG. 7, it is possible to receive a TV broadcast in the frequency band 46 to 887 MHz as shown in the bands (A) to (C) given earlier. In addition, since the center frequency and pass bandwidth of the poly-phase band filter 24 can be changed, the front-end circuit 10 is capable of receiving TV broadcasts from not only domestic ground digital and analog broadcastings, but also international ground digital and analog broadcastings.

(Typical High-Frequency Stage)

Figure 8:
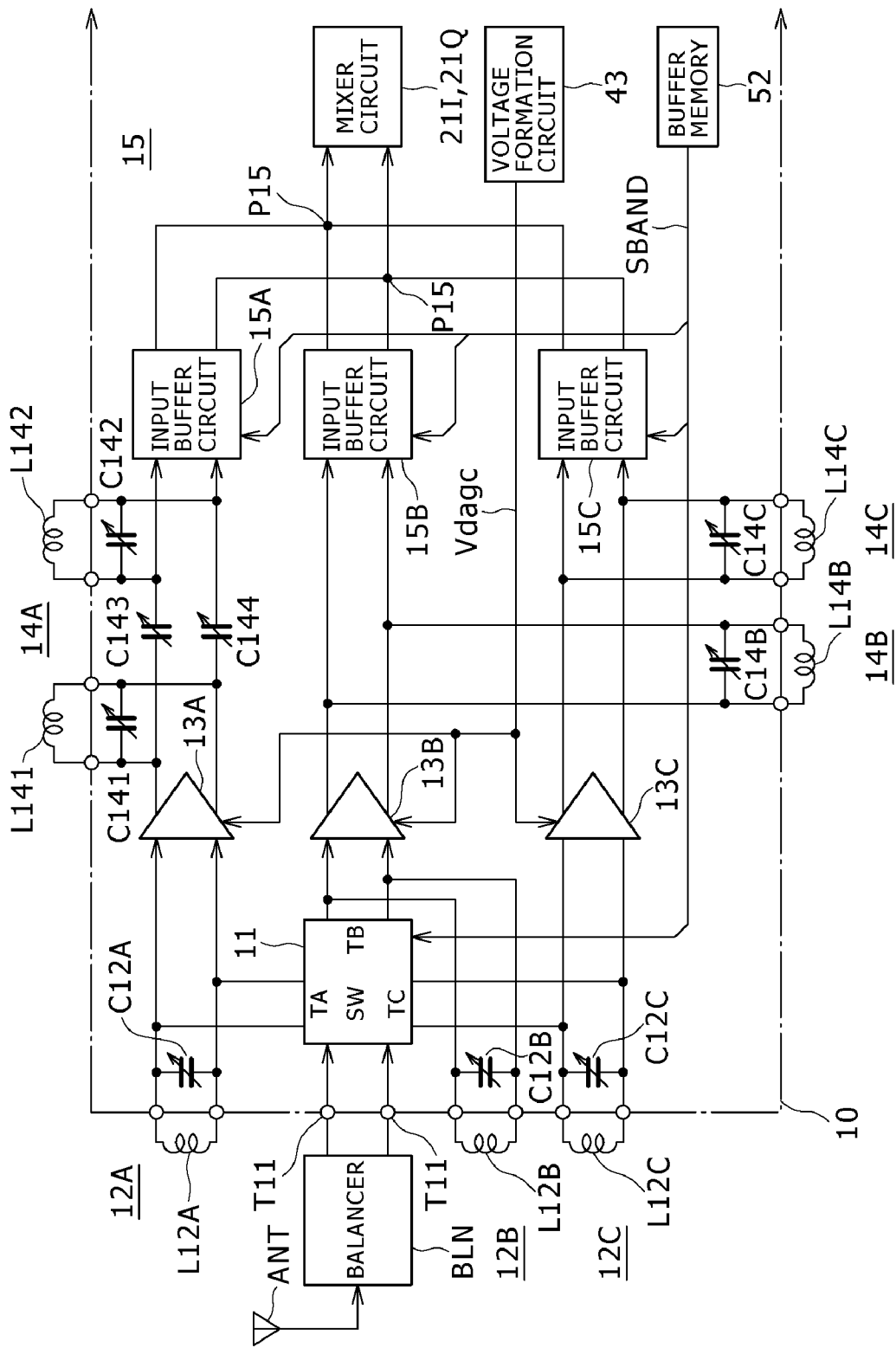
FIG. 8 is an explanatory diagram showing a typical configuration of a high-frequency amplification stage of a TV tuner employing a variable-gain amplification circuit according to an embodiment of the present invention.

FIG. 8 is a diagram showing a typical high-frequency signal processing system employing components ranging from the switch circuit 11 to the switch circuit 15, which are employed in the front-end circuit 10 shown in FIG. 7. It is to be noted that this high-frequency signal processing system is also designed into a balance-type configuration.

A signal received by the antenna ANT is converted by a balancer BLN into a balanced received signal, which is then supplied to the switch circuit 11 by way of the terminal pins T11 and T11. An equivalent block of the switch circuit 11 is shown in the configuration of FIG. 7. As is obvious from the equivalent block, the switch circuit 11 selects one of the antenna tuning circuits 12A to 12C as a recipient of the balanced received signal supplied to the switch circuit 11 by way of the terminal pins T11 and T11.

The first output terminals TA of the switch circuit 11 are connected to the input terminals of the high-frequency amplifier 13A. The antenna tuning circuit 12A forming a parallel circuit having an antenna tuning coil L12A and an antenna tuning capacitor C12A is connected between the first output terminals TA, which are connected to the input terminals of the high-frequency amplifier 13A as described above. The antenna tuning coil L12A is an external coil connected to the antenna tuning capacitor C12A embedded in the front-end circuit 10 through terminal pins of the front-end circuit 10 to form the parallel circuit 12A. It is to be noted that, as will be described later, the capacitance of the antenna tuning capacitor C12A is changed in accordance with digital data in order to vary the resonance frequency of the antenna tuning circuit 12A.

The output terminals of the high-frequency amplifier 13A are connected to the input terminals of an input buffer circuit 15A through tuning capacitors C143 and C144. As described earlier, the inter-stage tuning circuit 14A employed in the configuration shown in FIG. 7 is a double inter-stage tuning circuit having first and second inter-stage tuning circuits 14A provided between the high-frequency amplifier 13A and the input buffer circuit 15A. The first inter-stage tuning circuit 14A forming a parallel circuit 141 having an inter-stage tuning coil L141 and an inter-stage tuning capacitor C141 is connected between the output terminals of the high-frequency amplifier 13A. On the other hand, the second inter-stage tuning circuit 14A forming a parallel circuit 142 having an inter-stage tuning coil L142 and an inter-stage tuning capacitor C142 is connected between the input terminals of the input buffer circuit 15A.

It is to be noted that the inter-stage tuning coil L141 is an external coil connected to the inter-stage tuning capacitor C141 embedded in the front-end circuit 10 through terminal pins of the front-end circuit 10. By the same token, the inter-stage tuning coil L142 is an external coil connected to the inter-stage tuning capacitor C142 embedded in the front-end circuit 10 through terminal pins of the front-end circuit 10. The tuning capacitors C143 and C144 are also capacitors embedded in the front-end circuit 10. The capacitances of the capacitors C141 to C144 are changed in accordance with digital data in order to vary the resonance frequency of the double inter-stage tuning circuit 14A. The antenna tuning circuit 12A, the high-frequency amplifier 13A, the double inter-stage tuning circuit 14A and the input buffer circuit 15A described above form a high-frequency stage corresponding to the VL band described in band item (A) given earlier.

By the same token, the second output terminals TB of the switch circuit 11 are connected to the input terminals of the high-frequency amplifier 13B. The antenna tuning circuit 12B forming a parallel circuit is connected to the signal lines between the second output terminals TB and the input terminals of the high-frequency amplifier 13B.

The output terminals of the high-frequency amplifier 13B are connected to the input terminals of an input buffer circuit 15B. The inter-stage tuning circuit 14B forming a parallel circuit having an inter-stage tuning coil L14B and an inter-stage tuning capacitor C14B is connected between the output terminals of the high-frequency amplifier 13B and between the input terminals of the input buffer circuit 15B. It is to be noted that the inter-stage tuning coils L12B and L14B is external coils connected to the inter-stage tuning capacitors C12B and C14B embedded in the front-end circuit 10 through terminal pins of the front-end IC 10. The capacitance of the capacitor C14B is changed in accordance with digital data in order to vary the resonance frequency of the inter-stage tuning circuit 14B. The antenna tuning circuit 12B, the high-frequency amplifier 13B, the inter-stage tuning circuit 14B and the input buffer circuit 15B described above form a high-frequency stage corresponding to the VH band described in band item (B) given earlier.

In the same way, the third output terminals TC of the switch circuit 11 are connected to the input terminals of the high-frequency amplifier 13C. The antenna tuning circuit 12C forming a parallel circuit having an antenna tuning coil L12C and an antenna tuning capacitor C12C is connected between the third output terminals TC. The antenna tuning coil L12C is an external coil connected to the antenna tuning capacitor C12C embedded in the front-end circuit 10 through terminal pins of the front-end circuit 10 to form the parallel circuit 12C. The output terminals of the high-frequency amplifier 13C are connected to the input terminals of an input buffer circuit 15C. The inter-stage tuning circuit 14C forming a parallel circuit having an inter-stage tuning coil L14C and an inter-stage tuning capacitor C14C is connected between the output terminals of the high-frequency amplifier 13C and between the input terminals of the input buffer circuit 15C. It is to be noted that the inter-stage tuning coil L14C is an external coil connected to the inter-stage tuning capacitor C14C embedded in the front-end circuit 10 through terminal pins of the front-end circuit 10 to form the parallel circuit 14C. The antenna tuning circuit 12C, the high-frequency amplifier 13C, the inter-stage tuning circuit 14C and the input buffer circuit 15C described above form a high-frequency stage corresponding to the U band described in band item (C) given earlier.

The output terminals of each of the input buffer circuits 15A to 15C are connected to connection points P15 and P15 common to the input buffer circuits 15A to 15C. The connection points P15 and P15 are connected to the mixer circuits 21I and 21Q. In addition, the delay AGC voltage formation circuit 43 supplies the delayed AGC voltage Vdagc to the high-frequency amplifiers 13A to 13C.

On top of that, the buffer memory 52 supplies a band switching signal SBAND to the switch circuit 11 and the input buffer circuits 15A to 15C as a control signal for enabling the input buffer circuits 15A to 15C to carry out an operation or disabling the input buffer circuits 15A to 15C from carrying out an operation. In this way, the input buffer circuits 15A to 15C operate in a manner interlocked with the switching operation of the switch circuit 11. The input buffer circuits 15A to 15C form the switch circuit 15.

Let us assume that the band switching signal SBAND selects the VL band described in band item (A) given earlier. In this case, in accordance with the configuration shown in FIG. 8, the switch circuit 11 supplies a received signal to the antenna tuning circuit 12A and the input buffer circuit 15A is enabled to carry out an operation. At the same time, the switch circuit 11 does not supply the received signal to either the antenna tuning circuit 12B or antenna tuning circuit 12C whereas the input buffer circuits 15B and 15C are disabled from carrying out an operation.

Thus, in this state, the high-frequency stage shown in FIG. 8 is capable of receiving signals having frequencies in the VL band described in band item (A) and a signal of a channel selected by the antenna tuning circuit 12A and the inter-stage tuning circuit 14A as a channel with a frequency in the band is output to the mixer circuits 21I and 21Q by way of the connection points P15 and P15. An operation to receive a signal having a frequency in the VH band described in band item (B) or the U band described in band item (C) is carried out in the same way as the operation to receive a signal having a frequency in the VL band described in band item (A).

As described above, the high-frequency stage shown in FIG. 8 is capable of selecting one of the bands described in band items (A) to (C) and selecting a channel of a received signal with a frequency in the selected band. With a band selected, one of the high-frequency amplifiers 13A to 13C is connected to the corresponding one of the inter-stage tuning circuits 14A to 14C. Thus, the load can be reduced and the number of distortions caused by the high-frequency amplifiers 13A to 13C can be decreased.

Embodiment Applied to the High-Frequency Amplifiers 13A to 13C

The variable-gain amplification circuits each described above as a variable-gain amplification circuit according to an embodiment of the present invention can be used as the high-frequency amplifiers 13A to 13C, which are each also referred to as an RF AGC amplifier.

Figure 9:
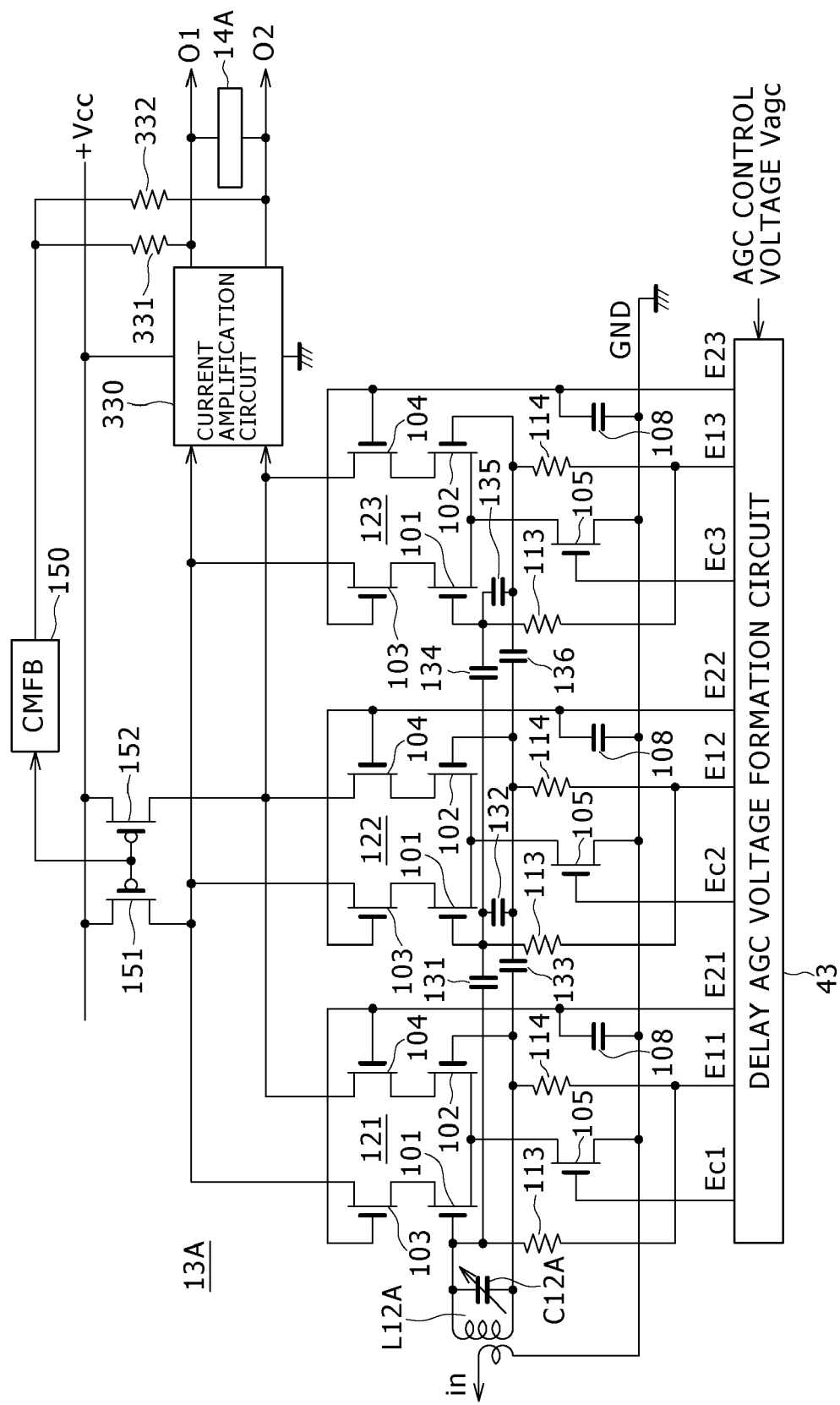
FIG. 9 is an explanatory diagram showing a first typical concrete circuit employed at the high-frequency amplification stage of a TV tuner as a variable-gain amplification circuit according to an embodiment of the present invention.

FIG. 9 is a diagram showing a typical configuration in which a three-stage variable-gain amplification circuit employing three variable-gain amplifiers, i.e., the first, second and third variable-gain amplifiers 121, 122 and 123, in the same way as the embodiment implementing a three-stage variable-gain amplification circuit shown in FIG. 6 is used for example as the high-frequency amplifier 13A.

In the typical configuration shown in FIG. 9, a signal received by the antenna tuning circuit 12A having the antenna tuning coil L12A and the antenna tuning capacitor C12A is supplied to the first variable-gain amplifier 121 as it is, supplied to the second variable-gain amplifier 122 by way of attenuator having the capacitors 131, 132 and 133 and supplied to the third variable-gain amplifier 123 by way of attenuator having the capacitors 134, 135 and 136.

A differential output appearing at the drains of the third MOSFET 103 and the fourth MOSFET 104, which are employed in each of the first variable-gain amplifier 121, the second variable-gain amplifier 122 and the third variable-gain amplifier 123, is supplied to the current amplifiers 301 and 302 shown in FIG. 5. The current amplifiers 301 and 302 compose a current amplification circuit 330. The amplified signal generated by the current amplification circuit 330 appears between the output terminals O1 and O2. The inter-stage tuning circuit 14A is connected between the output terminals O1 and O2.

The output terminals O1 and O2 are connected to each other by resistors 331 and 332, a connection point common to which is connected to the input end of the common feedback circuit 150. As described earlier, the common feedback circuit 150 applies a common feedback to the gates of the two p-channel MOSFETs 151 and 152. The common feedback controls a current flowing through the p-channel MOSFET 151 to a magnitude equal to a current flowing through the third MOSFET 103 and the first MOSFET 101, which are employed in each of the first variable-gain amplifier 121, the second variable-gain amplifier 122 and the third variable-gain amplifier 123. The common feedback also controls a current flowing through the p-channel MOSFET 152 to a magnitude equal to a current flowing through the fourth MOSFET 104 and the second MOSFET 102, which are employed in each of the first variable-gain amplifier 121, the second variable-gain amplifier 122 and the third variable-gain amplifier 123. In this way, control is executed so that no DC current is generated as an output of the high-frequency amplifier 13A.

The delay AGC voltage formation circuit 43 employed in the embodiment shown in FIG. 8 corresponds to the AGC control circuit 140 included in the configuration shown in FIG. 2, 5 or 6. The delay AGC voltage formation circuit 43 generates the gain control voltages E21, E22 and E23, the gate bias voltages E11, E12 and E13 as well as the current-source control voltages Ec1, Ec2 and Ec3. The delay AGC voltage formation circuit 43 supplies the gain control voltages E21, E22 and E23 to the first variable-gain amplifier 121, the second variable-gain amplifier 122 and the 123 respectively. By the same token, the delay AGC voltage formation circuit 43 supplies the gate bias voltages E11, E12 and E13 to the first variable-gain amplifier 121, the second variable-gain amplifier 122 and the 123 respectively. In the same way, the delay AGC voltage formation circuit 43 supplies the current-source control voltages Ec1, Ec2 and Ec3 to the first variable-gain amplifier 121, the second variable-gain amplifier 122 and the 123 respectively.

As described before, the delay AGC voltage formation circuit 43 receives a signal from the adder 42 as a signal representing the sum of an AGC voltage received from the terminal pin T16 and a detection signal received from the level detection circuit 41 as detection signal indicating whether or not the levels of the signals SIFI and SIFQ are higher than their respective thresholds determined in advance. If the levels of the signals SIFI and SIFQ are higher than the levels of the signals SIFI and SIFQ prior to execution of the AGC by the AGC variable-gain amplifier 26, first of all, the gain of the first variable-gain amplifier 121 is attenuated. If the levels of the signals SIFI and SIFQ further increase, the first variable-gain amplifier 121 is turned off whereas the second variable-gain amplifier 122 is turned on in switching from the first variable-gain amplifier 121 to the second variable-gain amplifier 122. If the levels of the signals SIFI and SIFQ still further increase, the second variable-gain amplifier 122 is turned off whereas the third variable-gain amplifier 123 is turned on in switching from the second variable-gain amplifier 122 to the third variable-gain amplifier 123. The switching from one variable-gain amplifier to another is carried out by properly supplying the gain control voltages E21, E22 and E23 as well as the gate bias voltages E11, E12 and E13 to the first variable-gain amplifier 121, the second variable-gain amplifier 122 and the third variable-gain amplifier 123 respectively.

The embodiment shown in FIG. 9 implements a high-frequency amplifier capable of carrying out AGC by generating small distortions even for broad-band TV signals received by the embodiment implementing a front-end circuit shown in FIG. 7 as input signals having levels varying over a wide range.

In addition, in the embodiment implementing a high-frequency amplifier as shown in FIG. 9, variable-frequency tuning circuits each employing a capacitor having a variable capacitance are employed at stages preceding and succeeding the amplifier. The capacitors each having a variable capacitor each function as a tracking filter. It is thus possible to reduce distortions by making use of a signal attenuating the gain of the variable-gain amplification circuit and, at the same time, eliminate as many unnecessary disturbance signals as possible.

[Typical Configuration of the AGC Control Circuit (Delay AGC Voltage Formation Circuit)]

The following description explains a circuit for generating the gain control voltages E21, E22 and E23 as well as the gate bias voltages E11, E12 and E13. The following description also explains a switching circuit for switching the current source generating a current from one to another by making use of the current-source control voltages Ec1, Ec2 and Ec3 generated by the switching circuit. Generated on the basis of an AGC voltage received from a base band circuit, the gain control voltages E21, E22 and E23, the gate bias voltages E11, E12 and E13 as well as the current-source control voltages Ec1, Ec2 and Ec3 are supplied directly to the three-stage variable-gain amplification circuit implemented by the embodiment shown in FIG. 9 in order to set a voltage and operation current of each terminal in the embodiment at a voltage and operation current of a target operation explained earlier by referring to the basic circuit shown in FIG. 1. The circuit for generating the gain control voltages E21, E22 and E23, the gate bias voltages E11, E12 and E13 as well as the switching circuit for switching the current source serves as the AGC circuit 140 (or the delay AGC voltage formation circuit 43).

Figure 10:
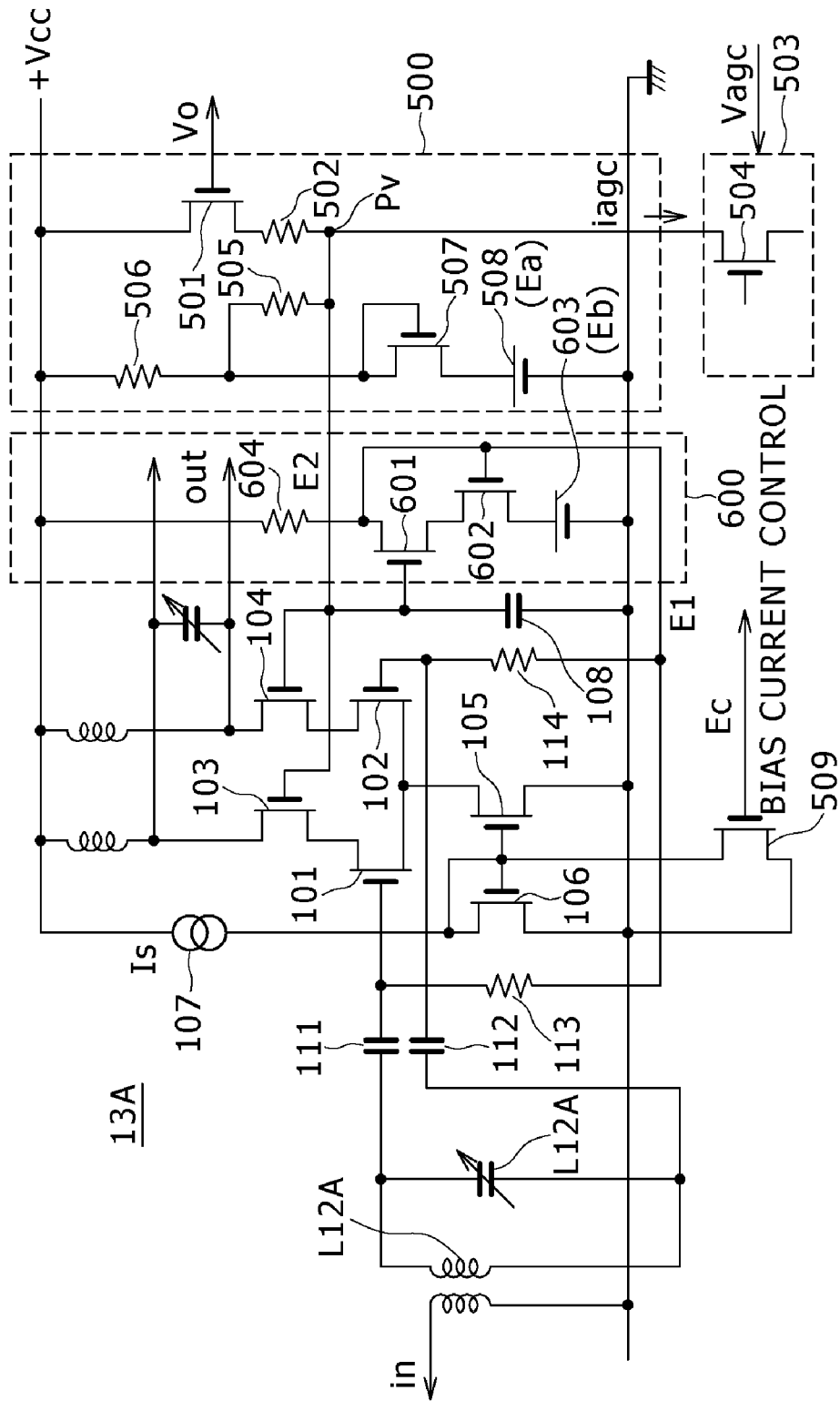
FIG. 10 is an explanatory diagram showing a typical concrete circuit of a variable-gain amplification circuit according to an embodiment of the present invention.

FIG. 10 is an explanatory diagram showing a typical basic circuit configuration of a single-stage variable-gain amplification circuit including one variable-gain amplifier. Components employed in the configuration as components identical with their respective counterparts included in the configurations shown in FIGS. 1 and 9 are denoted by the same reference numerals as the counterparts.

As shown in FIG. 10, in this embodiment, a gain control voltage generation circuit 500 generates a gain control voltage E2. The gain control voltage generation circuit 500 includes a MOSFET 501, the gate of which receives a voltage Vo determined in advance. The drain of the MOSFET 501 is connected to the power-supply line of the voltage power supply +Vcc whereas the source thereof is connected to the drain of a MOSFET 504 employed in a voltage/current conversion circuit 503 through a resistor 502.

The voltage/current conversion circuit 503 receives the AGC voltage Vagc from the base band circuit mentioned earlier as a voltage applied to the gate of the MOSFET 504. By adjusting the AGC voltage Vagc applied to the gate of the MOSFET 504, a current iagc flowing through the MOSFET 501 and the resistor 502 can be controlled. The gain control voltage E2 cited above is a voltage appearing at a connection point Pv common to the resistor 502 and the voltage/current conversion circuit 503. The gain control voltage E2 varies in accordance with the current iagc. The gain control voltage E2 is applied to the gates of the third MOSFET 103 and the fourth MOSFET 104.

The connection point Pv is connected to the power-supply line of the voltage power supply +Vcc through a series circuit having resistors 505 and 506. A connection point common to the resistors 505 and 506 is connected to the terminal of the ground through a series circuit having a diode-connected MOSFET 507 and a reference-voltage source 508 for generating a reference voltage Ea.

In the typical configuration shown in FIG. 10, the connection point Pv at which the gain control voltage E2 is generated is also connected to the gate of a MOSFET 601 employed in a gate bias voltage generation circuit 600. The source of the MOSFET 601 is connected to the terminal of the ground through a series circuit having the drain and source of a MOSFET 602 and a reference-voltage source 603 for generating a reference voltage Eb.

The drain of the MOSFET 601 is connected to the power-supply line of the voltage power supply +Vcc through a resistor 604 and also connected to the gate of the MOSFET 602. A voltage appearing at the drain of the MOSFET 601 is applied to the gates of the first MOSFET 101 and the second MOSFET 102 as a gate bias voltage E1 through a series circuit having resistors 113 and 114.

A connection point common to the gates of MOSFETs 105 and 106 composing a current-mirror circuit is connected to the terminal of the ground through the drain and source of a MOSFET 509 for controlling a bias current. The gate of the bias-current control MOSFET 509 receives the current-source control voltage Ec.

The operation of the embodiment shown in FIG. 10 is explained as follows.

When the AGC voltage Vagc received from the base band circuit provided at a later stage is zero, the current iagc is also zero, resulting in a maximum gain of the high-frequency amplifier 13A. In this state, the MOSFET 501 employed in the gain control voltage generation circuit 500 is in an off state. Thus, a sum voltage (Ea+Vgs) is applied to the gates of the third MOSFET 103 and the fourth MOSFET 104, which compose a differential amplifier, through the resistor 505 as the gain control voltage E2. Here, notation Ea denotes the reference voltage generated by the reference-voltage source 508 whereas notation Vgs denotes a voltage appearing between the gate and source of the MOSFET 507.

On the other hand, the gate bias voltage E1 applied to the gates of the first MOSFET 101 and the second MOSFET 102 is equal to a sum voltage (Vgs+Eb) where notation Vgs denotes a voltage appearing between the gate and source of the MOSFET 602 whereas notation Eb denotes the reference voltage generated by the reference-voltage source 603. This is because, since the gain control voltage E2 is high, the MOSFET 601 employed in the gate bias voltage generation circuit 600 is in an on state.

As a result, a voltage appearing between the drain and source of each of the first MOSFET 101 and the second MOSFET 102 is equal to about (Ea−Eb) whereas the drain voltage of the MOSFET 105 is settled at about the reference voltage Eb.

In addition, in the typical configuration shown in FIG. 10, the operation current of the differential amplifier is a constant current determined by a reference current Is generated by the variable-current source 107 and a transistor size ratio of a current mirror composed of the MOSFETs 105 and 106.

When the AGC voltage Vagc received by the voltage/current conversion circuit 503 from the base band circuit provided at a later stage is added in order to reduce the gain from the maximum value in the maximum-gain state described above, the current iagc flows through the gain control voltage generation circuit 500. The current iagc is obtained as a result of voltage-current conversion carried out by the voltage/current conversion circuit 503 to convert the AGC voltage Vagc into the current iagc.

In this state, if a voltage difference (Vo−E2), where notation Vo denotes a voltage appearing at the gate of the MOSFET 501 whereas notation E2 denotes the gain control voltage E2, is equal to or lower than the threshold voltage Vth of the MOSFET 501, the current iagc flows through the resistor 505, the resistor 506 and the MOSFET 509 till the MOSFET 501 is turned off, causing the gain control voltage E2 to decrease very fast. As a result, the first MOSFET 101 and the second MOSFET 102 make a transition from a saturated region to a three-pole tube region, causing the gain of the variable-gain amplification circuit to start decreasing.

Figure 11:
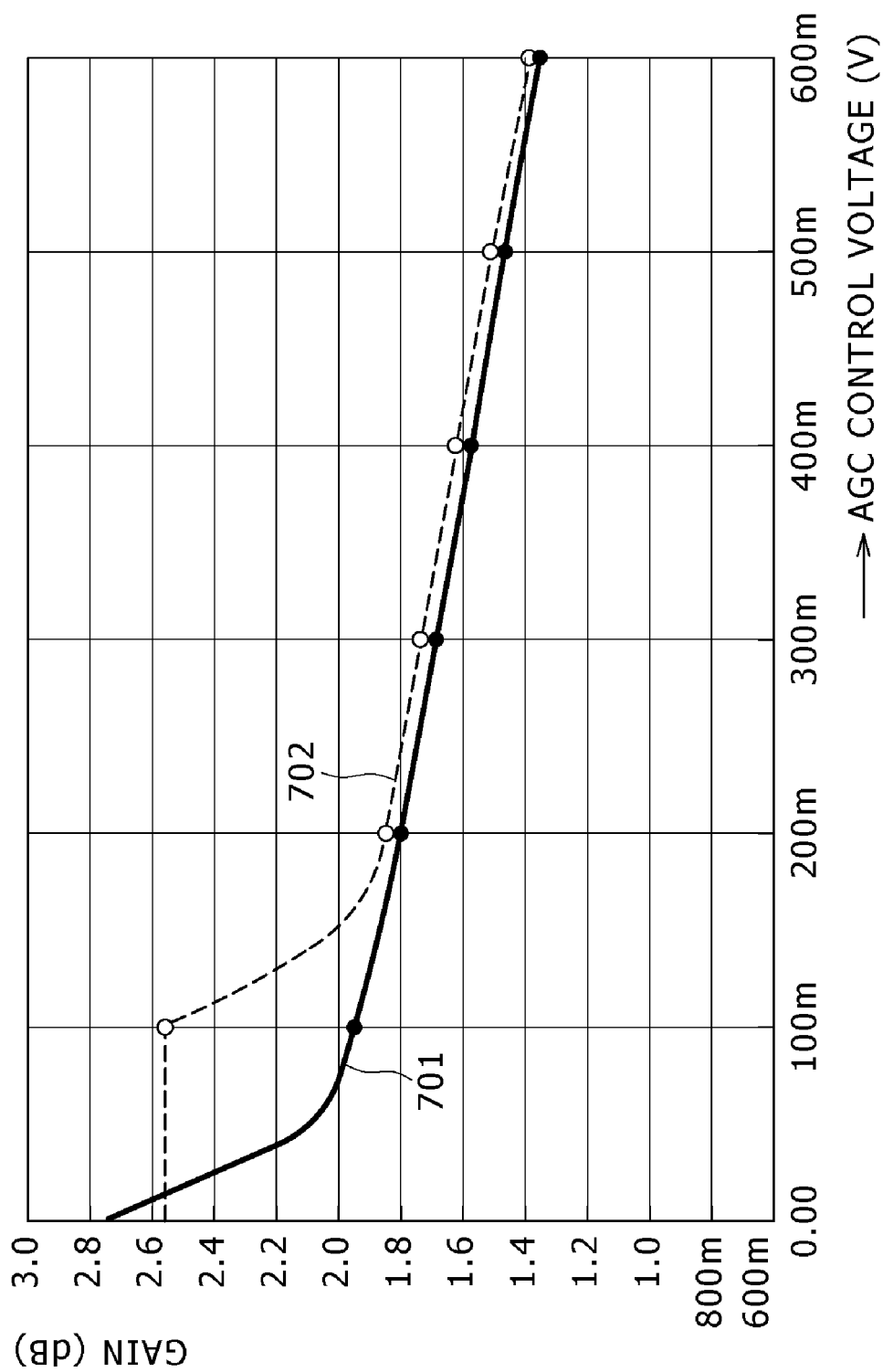
FIG. 11 is a diagram showing characteristic curves each showing gain variations in a variable-gain amplification circuit according to an embodiment of the present invention.

With this timing, the MOSFET 501 begins to electrically conduct, causing the current iagc to further increase. The increasing current iagc flows through mainly a series circuit having the resistor 502 and the MOSFET 501. Due to the current flowing through the MOSFET 501 and the gate-source voltage Vgs of the MOSFET 501, the gradient of a line representing the drop of the gain control voltage E2 with the increase of the current iagc becomes gradual. FIG. 11 is a diagram showing characteristic curves 701 each showing a relation between the gain control voltage E2 and the current iagc. It is to be noted that, as is obvious from the figure, the characteristic curve 701 can be changed to a certain degree in accordance with resistances of resistors and MOSFET sizes.

As shown by the characteristic curves 701 of FIG. 11, in the AGC range, the gain control voltage E2 represented by the vertical axis provided for the gain of the variable-gain amplification circuit does not drop to a level lower than a certain voltage.

In addition, at the same time, as the gain control voltage E2 drops, the MOSFET 601 employed in the gate bias voltage generation circuit 600 makes a transition from an on state to an off state. Thus, the voltage appearing between the drain and source of the MOSFET 602 also decreases and the voltage Vgs appearing between the gate and source of the MOSFET 601 as a voltage flowing a current through the resistor 604 increases. As a result, the gate bias voltage E1 applied to the gates of the first MOSFET 101 and the second MOSFET 102 increases. In this state, the AGC voltage Vagc according to this embodiment controls the gain of the variable-gain amplification circuit.

By the way, in many cases, it is necessary to take variations of characteristics of MOSFETs in use into consideration. Such variations are caused by variations in manufacturing process. In the case of the AGC voltage Vagc according to this embodiment, however, in a state set by a zero AGC voltage Vagc as the maximum-gain state of the variable-gain amplification circuit, the gain of the variable-gain amplification circuit is sustained at a constant value determined by the reference voltages Ea and Eb without being affected by a voltage appearing between the gate and source of each MOSFET.

Figure 12:
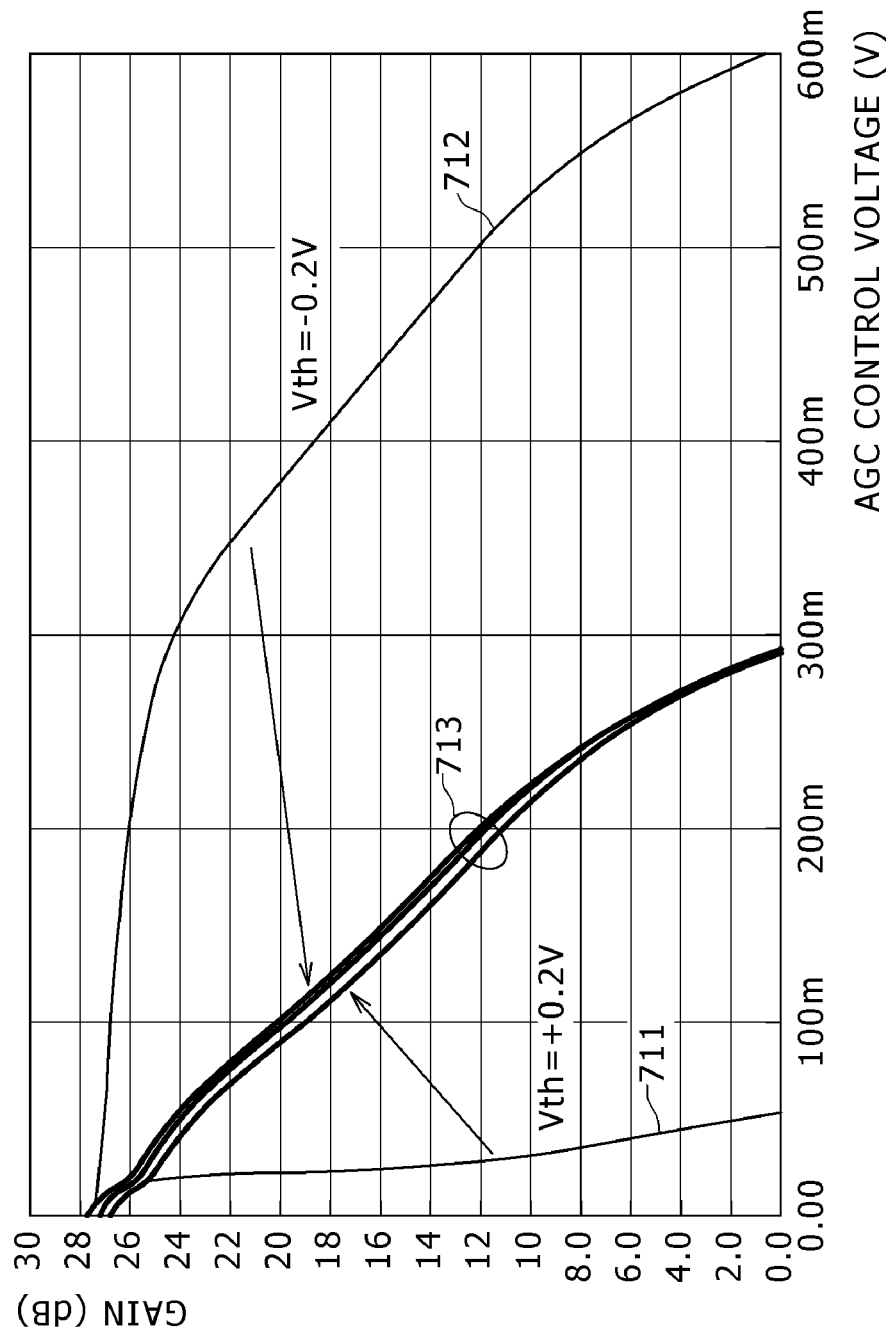
FIG. 12 is a diagram showing characteristic curves each showing gain variations in an improved variable-gain amplification circuit according to an embodiment of the present invention.

In an operation to control the gain of the variable-gain amplification circuit to a variable value by applying the AGC voltage Vagc, however, it is necessary to take variations of characteristics of MOSFETs in use into consideration as variations caused by variations in manufacturing process. The characteristic curves shown in FIG. 12 are obtained by for a fixed voltage Vo applied to the gate of the MOSFET 501 employed in the gain control voltage generation circuit 500 of the typical configuration shown in FIG. 10. As is obvious from FIG. 12, undesirably much different characteristic (gain) curves are obtained if the characteristic of a MOSFET is changed. In the case of FIG. 12, the much different characteristic curves are resulted in by changing the threshold voltage Vth of the MOSFET.

To put it concretely, a characteristic curve 711 shown in FIG. 12 is a curve for the threshold voltage Vth of a MOSFET set at +0.2 V (volts). As shown in the figure, the characteristic curve 711 has a very steep gradient. On the other hand, a characteristic curve 712 shown in FIG. 12 is a curve for the threshold voltage Vth of a MOSFET set at −0.2 V (volts). As shown in the figure, the characteristic curve 712 has a very gradual gradient.

This is because the change of the gain of the variable-gain amplification circuit is dependent on the voltage appearing between the drain and source of each of the first MOSFET 101 and the second MOSFET 102. When the electric potential appearing on the source of each of the first MOSFET 101 and the second MOSFET 102 is fixed, the gain of the variable-gain amplification circuit is determined by a voltage Ed appearing on the drain of each of the third MOSFET 103 and the fourth MOSFET 104. In a range of changes of the gain of the variable-gain amplification circuit, the MOSFET 501 employed in the gain control voltage generation circuit 500 is electrically conducting and a voltage equal to (2×Vgs+Ed) may be required as the voltage Vo appearing on the gate of the MOSFET 501. That is to say, the gate voltage Vo may be required to include variations two times variations of the voltage Vgs appearing between the gate and source of the MOSFET.

Figure 13:
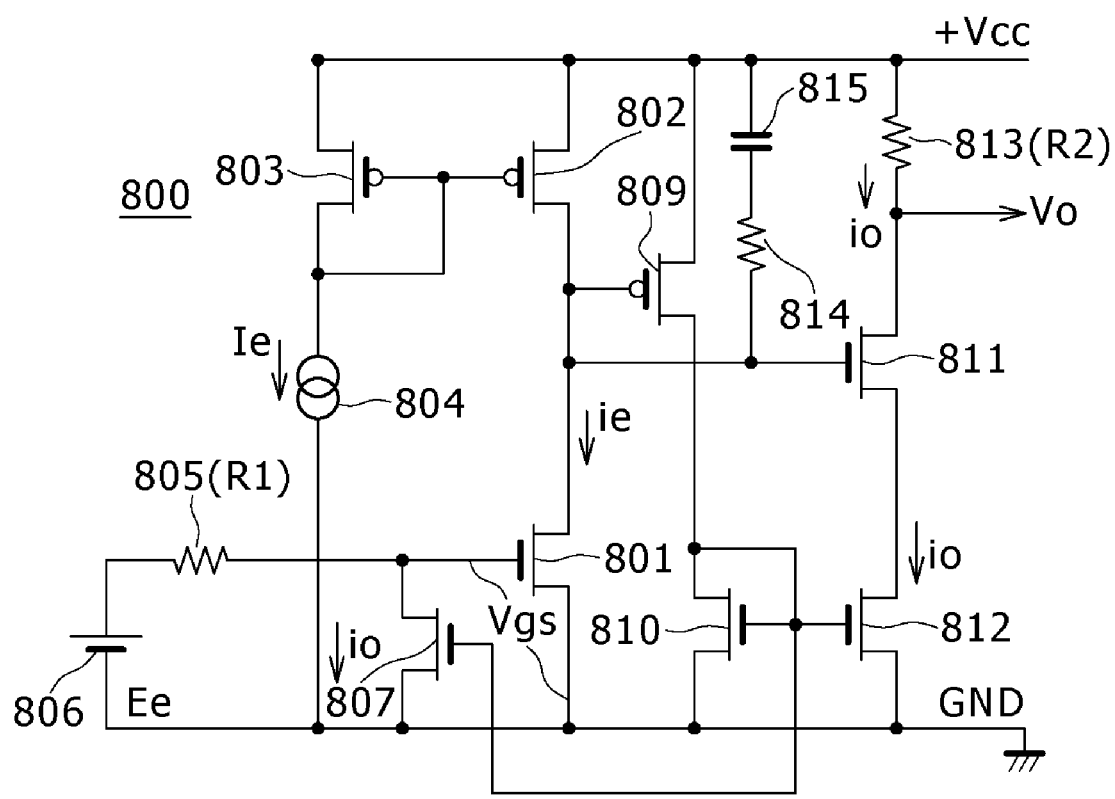
FIG. 13 is a diagram showing an improved variable-gain amplification circuit according to an embodiment of the present invention.

FIG. 13 is a diagram showing a typical Vo-voltage generation circuit 800 for generating the gate voltage Vo cited above.

In the typical Vo-voltage generation circuit 800 shown in FIG. 13, the source of a n-channel MOSFET 801 is connected to the terminal of the ground whereas the drain thereof is connected to the power-supply line of the voltage power supply +Vcc through the drain and source of a p-channel MOSFET 802.

The gate of the p-channel MOSFET 802 is connected to the gate of a diode-connected p-channel MOSFET 803 to form a current-mirror circuit. The drain of the p-channel MOSFET 803 is connected to the terminal of the ground through a current source 804 for generating a reference current Ie whereas the source thereof is connected to the power-supply line of the voltage power supply +Vcc.

The gate of the n-channel MOSFET 801 is connected to the terminal of the ground through a series circuit having a resistor 805 having a resistance R1 and a voltage source 806 for generating a voltage Ee. The gate of the n-channel MOSFET 801 is also connected to the terminal of the ground through the drain and source of a MOSFET 807.

A connection point common to the drains of the n-channel MOSFET 801 and the p-channel MOSFET 802 is connected the gate of a MOSFET 809. The source of the MOSFET 809 is connected to the power-supply line of the voltage power supply +Vcc. The drain of the MOSFET 809 is connected to the terminal of the ground through the drain and source of a diode-connected MOSFET 810. The gate of the diode-connected MOSFET 810 is connected to the gate of the MOSFET 807 to form a current-mirror circuit.

A connection point common to the drains of the n-channel MOSFET 801 and the p-channel MOSFET 802 is also connected the gate of a MOSFET 811. The source of the MOSFET 811 is connected to the terminal of the ground through the drain and source of a MOSFET 812, which forms a current-mirror circuit in conjunction with the MOSFET 810. The drain of the MOSFET 811 is connected to the power-supply line of the voltage power supply +Vcc through a resistor 813 having a resistance R2. A voltage appearing on the drain of the MOSFET 811 is the voltage Vo described earlier.

The gate of the MOSFET 811 is connected to the power-supply line of the voltage power supply +Vcc through a series circuit having a resistor 814 and a capacitor 815.

In the Vo-voltage generation circuit 800, a negative feedback is applied in order to flow the following current io through the MOSFET 807:

$$io=(Ee-Vgs)/R1$$

where notation Vgs denotes a voltage, which appears between the gate and source of the MOSFET 801 when the reference current Ie is flowing through the MOSFET 801 whereas notation Ee denotes the reference voltage generated by the voltage source 806.

If the output MOSFET 812 has the same size as the MOSFET 807, the current io flows through the MOSFET 812, generating an output voltage on the drain of the MOSFET 811 as the output voltage Vo.

With the current io flowing through the resistor 813 having the resistance R2, the voltage Vo is expressed by the following equation:

$$Vo=Vcc-R2(Ee-Vgs)/R1$$

If the resistance ratio R2/R1 is set at 2 (or R2/R1=2), the above equation can be rewritten into the following equation:

$$Vo=Vcc+2Vgs-2Ee$$

Thus, a voltage Vo compensated for MOSFET characteristic variations can be obtained from the Vo-voltage generation circuit 800. The voltage Vo generated by the Vo-voltage generation circuit 800 is supplied to the gate of the MOSFET 501 employed in the gain control voltage generation circuit 500 of the variable-gain amplification circuit shown in FIG. 10.

If variations of characteristics of MOSFETs in use exist as variations caused by variations in manufacturing process, by making use of the Vo-voltage generation circuit 800, it is possible to obtain gain-variation curves represented by a set of characteristic curves 713 shown in FIG. 12. The set of characteristic curves 713 represents gain variations satisfactorily compensated for MOSFET characteristic variations.

The embodiment described above by referring to FIG. 10 implements a variable-gain amplification circuit having a single-stage configuration. In the case of a variable-gain amplification circuit having a multi-stage configuration, the gain control voltage generation circuit 500 and the gate bias voltage generation circuit 600 are provided in each of the stages. However, one Vo-voltage generation circuit 800 is provided as a circuit common to all the gain control voltage generation circuits 500 provided at the stages and the voltage Vo generated by the Vo-voltage generation circuit 800 is applied as a bias voltage to the gates of the MOSFETs 501 each employed in one of the gain control voltage generation circuits 500.

In the case of a multi-stage variable-gain amplification circuit employing a number of variable-gain amplifiers each provided at a stage, a current supply control voltage for controlling the current Io flowing through the current-source MOSFET 105 is used for controlling a switching operation to turn off a specific one of the variable-gain amplifiers and turn on the variable-gain amplifier immediately succeeding the specific variable-gain amplifier.

Figure 14:
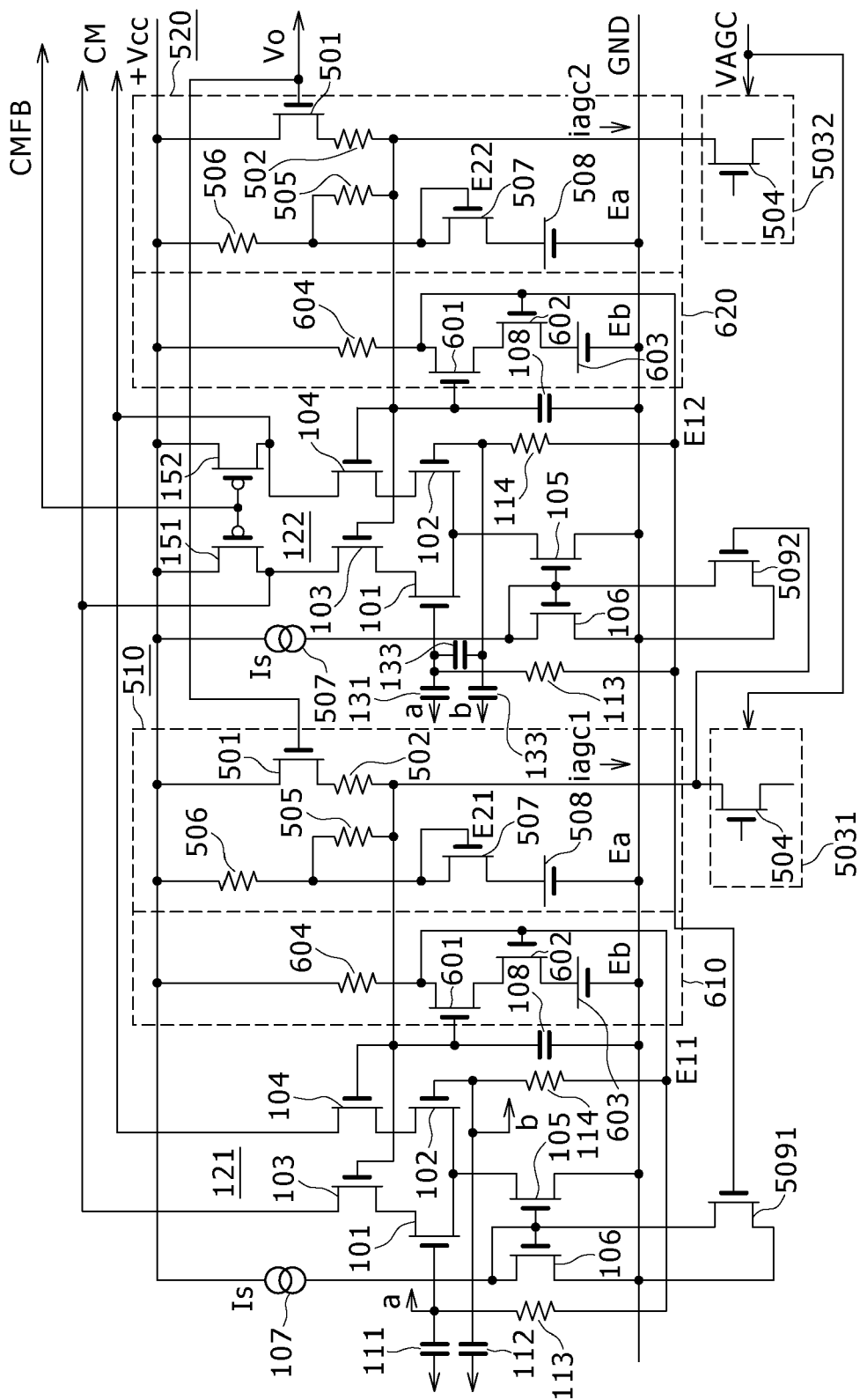
FIG. 14 is an explanatory diagram showing another typical concrete circuit of an embodiment implementing a variable-gain amplification circuit provided by the present invention.

FIG. 14 is a diagram showing a typical configuration of a two-stage variable-gain amplification circuit employing two variable-gain amplifiers, i.e., the first variable-gain amplifier 121 and the second variable-gain amplifier 122.

In the typical configuration shown in FIG. 14, the first variable-gain amplifier 121 is provided with a first gain control voltage generation circuit 510 and a first gate bias voltage generation circuit 610. By the same token, the second variable-gain amplifier 122 is provided with a second gain control voltage generation circuit 520 and a second gate bias voltage generation circuit 620.

A Vo-voltage generation circuit 800 not shown in the figure supplies the voltage Vo to the gate of the MOSFET 501 employed in each of the first and second gain control voltage generation circuits 510 and 520.

A first-stage MOSFET 5091 is provided as a MOSFET for controlling a current supplied to the first variable-gain amplifier 121 in accordance with the AGC voltage Vagc. By the same token, a second-stage MOSFET 5092 is provided as a MOSFET for controlling a current supplied to the second variable-gain amplifier 122 in accordance with the AGC voltage Vagc.

The gate of the first-stage MOSFET 5091 receives the gate bias voltage E12 generated by the second gate bias voltage generation circuit 620, which is provided for the second variable-gain amplifier 122 as described above. On the other hand, the gate of the second-stage MOSFET 5092 receives the gain control voltage E21 generated by the first gain control voltage generation circuit 510.

A first voltage/current conversion circuit 5031 is provided as a MOSFET for converting a voltage based on the AGC voltage Vagc into a current iagc1 to flow through the first gain control voltage generation circuit 510, which is provided for the first variable-gain amplifier 121 as described above. By the same token, a second voltage/current conversion circuit 5032 is provided as a MOSFET for converting a voltage based on the AGC voltage Vagc into a current iagc2 to flow through the second gain control voltage generation circuit 520, which is provided for the second variable-gain amplifier 122 as described above.

In the same way as the typical configuration shown in FIG. 5, the input signal is supplied to the gates of the first and second MOSFETs 101 and 102 employed in the first variable-gain amplifier 121 as it is without being attenuated. However, the input signal is divided by capacitors 131, 132 and 133 serving as an attenuator for attenuating the input signal before being supplied to the gates of the first and second MOSFETs 101 and 102 employed in the second variable-gain amplifier 122.

In the typical configuration shown in FIG. 14, however, the AGC voltage Vagc is provided with an offset in the first voltage/current conversion circuit 5031 and the second voltage/current conversion circuit 5032, which are each used for converting a voltage into a current as described above, at the start point of the gain control.

To put it in detail, in the first variable-gain amplifier 121, the gain control is begun from a start point corresponding to a zero AGC voltage Vagc as shown by the gain characteristic curve 701 of FIG. 11. In the second variable-gain amplifier 122, on the other hand, the gain control is begun from a start point corresponding to a AGC voltage Vagc higher than the zero AGC voltage Vagc by a voltage difference determined in advance as shown by the gain characteristic curve 702 of FIG. 11. By having the gain characteristic curves 701 and 702, it is possible to carry out switching from the first variable-gain amplifier 121 to the second variable-gain amplifier 122 or vice versa and change the gain of the variable-gain amplification circuit smoothly.

The second voltage/current conversion circuit 5032 employed in the configuration shown in FIG. 14 gives an offset to a point to start the flowing of the current iagc2 as an offset relative to a point to start the flowing of the current iagc1 in order to allow the switching to be carried out at any arbitrary point.

The operation of the two-stage variable-gain amplification circuit having the configuration shown in FIG. 14 is shown as follows.

In the maximum-gain state of the two-stage variable-gain amplification circuit having the configuration shown in FIG. 14, the current iagc1 flowing through the first gain control voltage generation circuit 510 and the current iagc2 flowing through the second gain control voltage generation circuit 520 are both zero. In this state, the gain control voltages E21 and E22 both have a high level. Since the gain control voltage E21 of the first variable-gain amplifier 121 is high, the MOSFET 5092 is in an on state so that no current is flowing through the second variable-gain amplifier 122. Thus, only the first variable-gain amplifier 121 operates.

When the AGC voltage Vagc rises from the level of the maximum-gain state of the variable-gain amplification circuit, the current iagc1 increases, reducing the gain control voltage E21. In accordance with the operation described earlier, the gain of the first variable-gain amplifier 121 decreases.

The gain control voltage E21 reduced in the state of a low gain determined in advance causes the MOSFET 5092 to make a transition from the on state to an off state, supplying a current to the second variable-gain amplifier 122. As a current is supplied to the second variable-gain amplifier 122, the operation of the second variable-gain amplifier 122 is started. At that time, the current iag2 has already been flowing, reducing the gain control voltage E22 so that an operation mode to reduce the gain of the variable-gain amplification circuit is established immediately. Thus, the gain of the variable-gain amplification circuit changes smoothly in the process of switching from the first variable-gain amplifier 121 to the second variable-gain amplifier 122.

As the gain control voltage E22 of the second variable-gain amplifier 122 drops, the gate bias voltage E11 rises as described earlier, causing the MOSFET 5091 to enter a conductive state. In this state, the current supplied to the first variable-gain amplifier 121 is reduced. This operation causes operation switching from the first variable-gain amplifier 121 to the second variable-gain amplifier 122.

Figure 15:
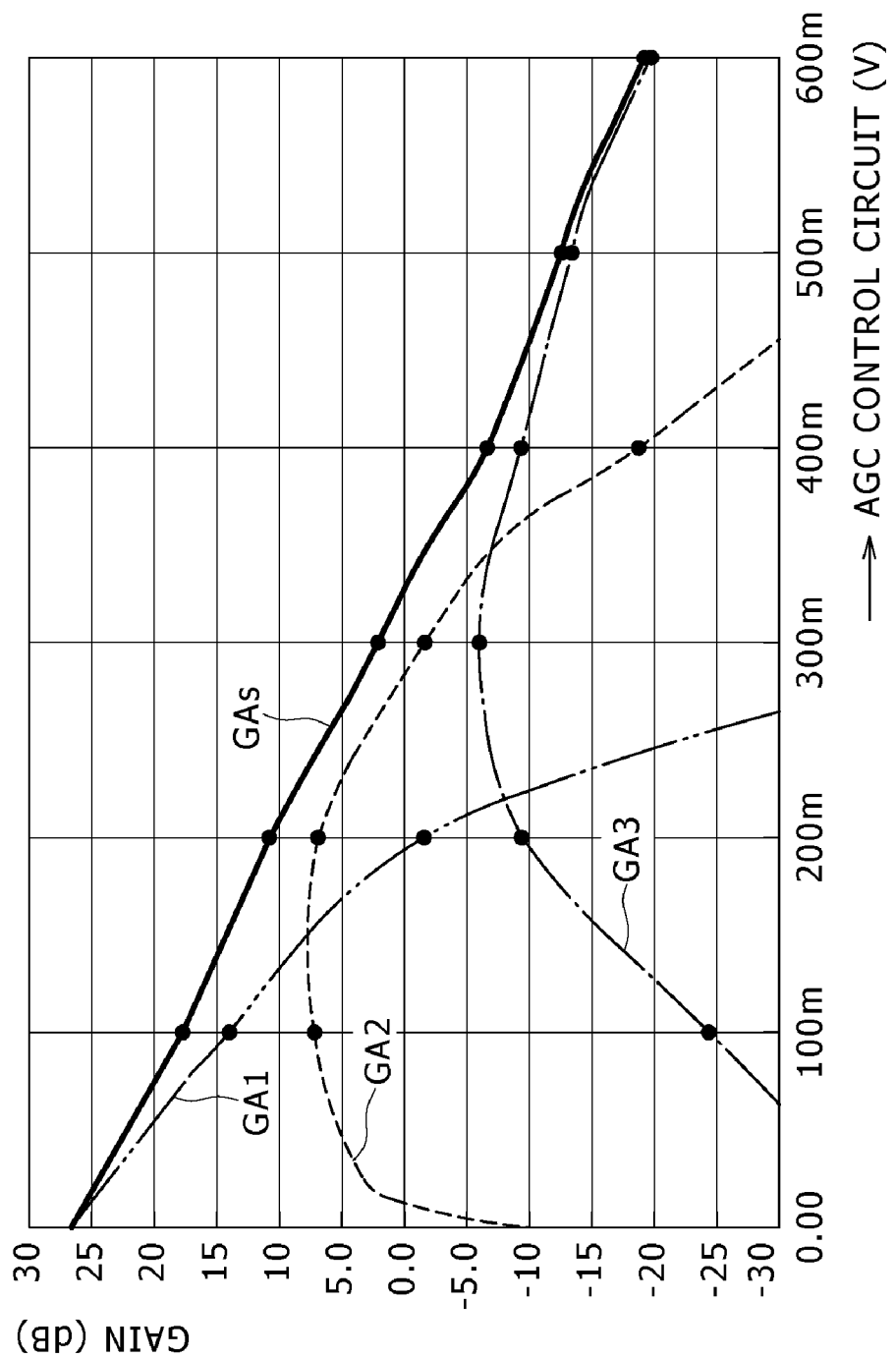
FIG. 15 is an explanatory diagram to be referred to in description of the variable-gain amplification circuit shown in FIG. 14.
Figure 16:
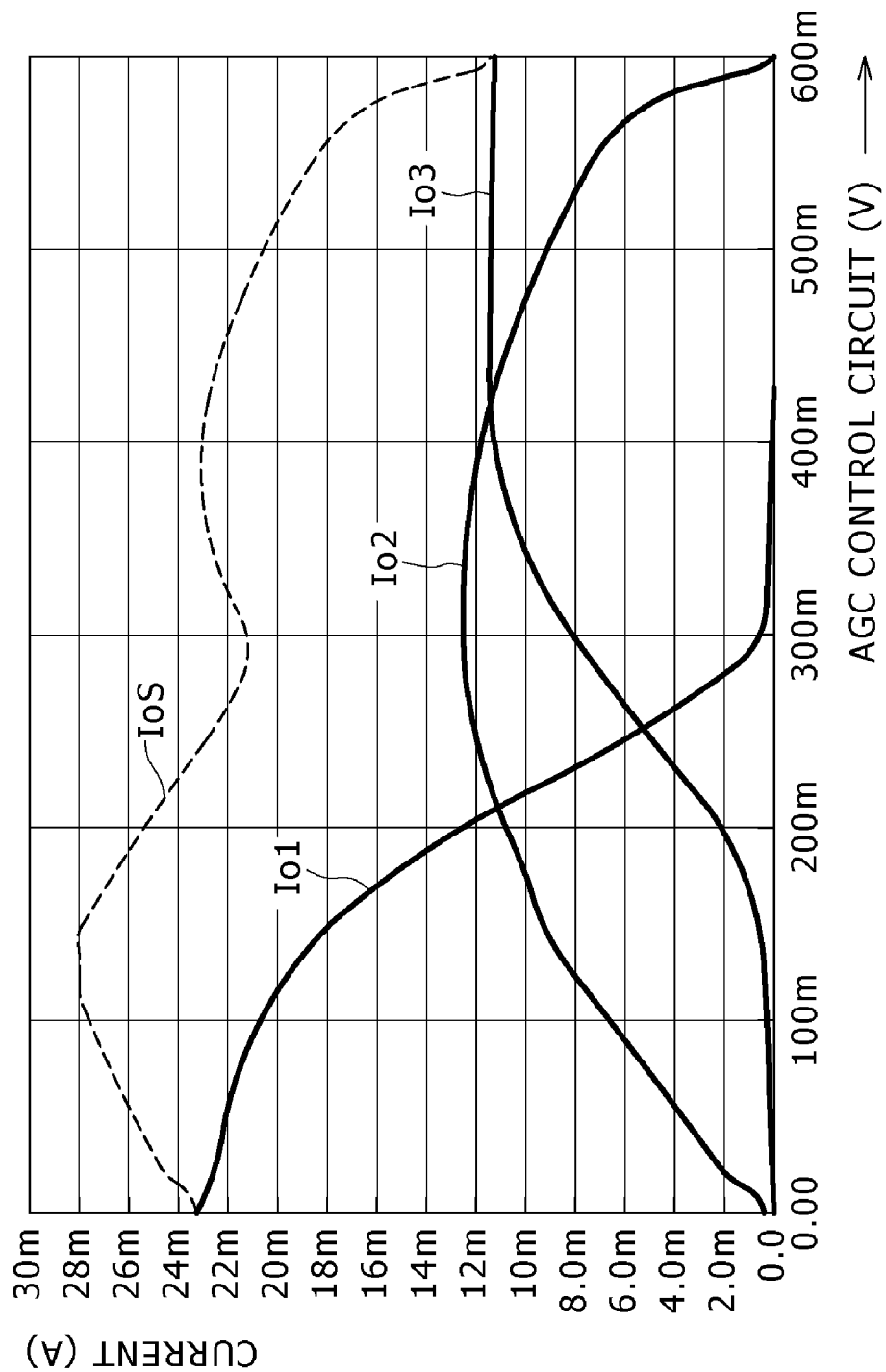
FIG. 16 is another explanatory diagram to be referred to in description of the variable-gain amplification circuit shown in FIG. 14.
Figure 17:
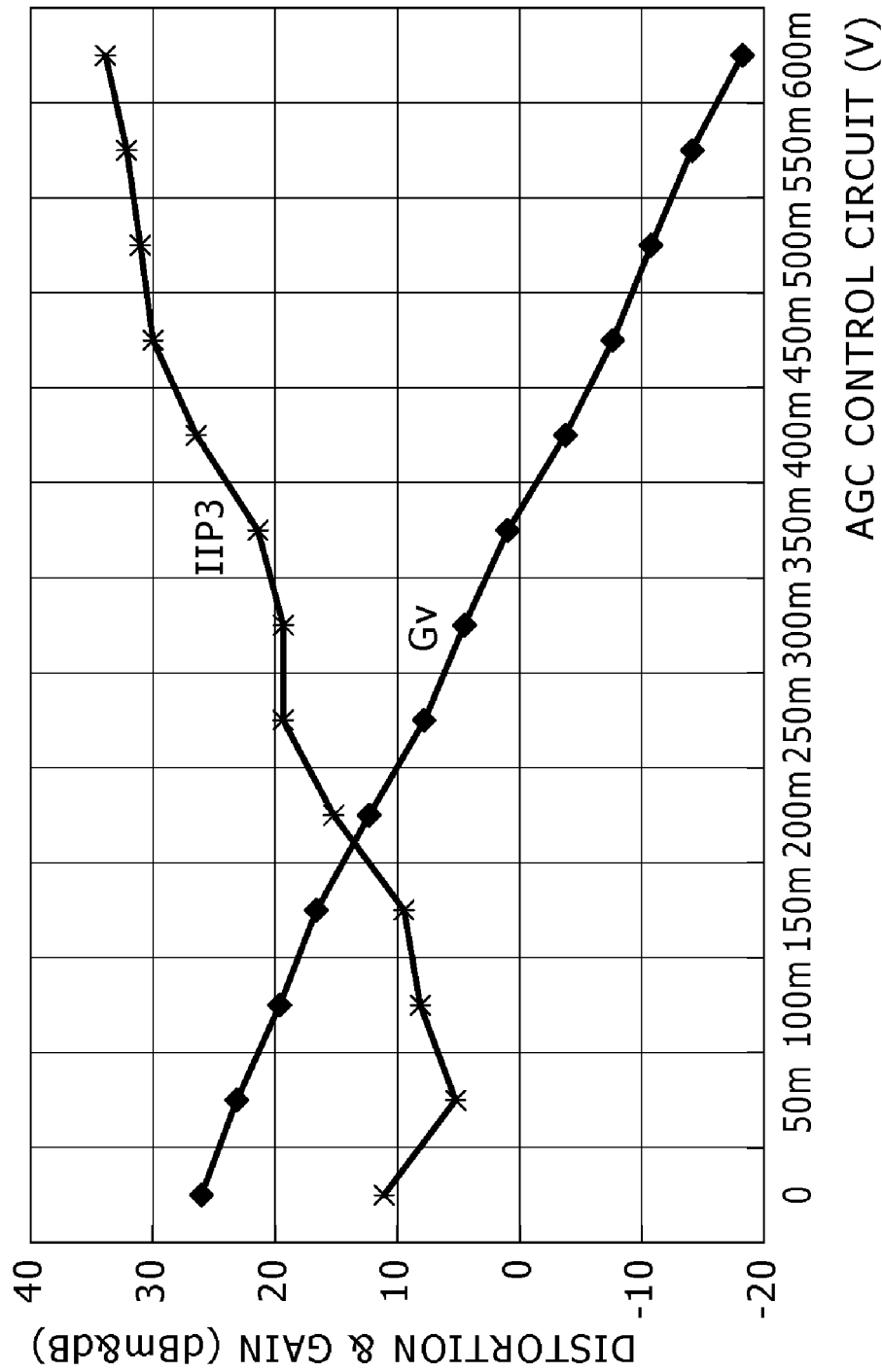
FIG. 17 is a further explanatory diagram to be referred to in description of the variable-gain amplification circuit shown in FIG. 14.

FIG. 15 is a diagram showing curves each representing a relation between the gain and the AGC voltage Vagc in switching processes carried out in a three-stage variable-gain amplification circuit employing three variable-gain amplifiers each according to the embodiment having the configuration shown in FIG. 1 at three stages respectively. FIG. 16 is a diagram showing curves each representing a relation between operation currents and the AGC voltage Vagc in the switching processes. FIG. 17 is a diagram showing curves representing a relation between the gain and the AGC voltage Vagc and a relation between the distortion and the AGC voltage Vagc in the switching processes.

That is to say, the curves shown in FIG. 15 each represent a relation between changes of the gain of a variable-gain amplification circuit having a three-stage configuration and the AGC voltage Vagc in switching processes of the variable-gain amplification circuit. To be more specific, a curve GA1 shown in FIG. 15 represents a relation between changes of the gain of the first variable-gain amplifier 121 and the AGC voltage Vagc, a curve GA2 shown in the same figure represents a relation between changes of the gain of the second variable-gain amplifier 122 and the AGC voltage Vagc whereas a curve GA3 shown in the same figure represents a relation between changes of the gain of the third variable-gain amplifier 123 and the AGC voltage Vagc. A curve GAs shown in FIG. 15 represents a relation between changes of the gain of the variable-gain amplification circuit having a three-stage configuration and the AGC voltage Vagc. As shown in the figure, the gain of the variable-gain amplification circuit having a three-stage configuration changes with the AGC voltage Vagc over a gain variation range of at least 45 dB. In addition, the gain of the variable-gain amplification circuit having a three-stage configuration reduces smoothly in spite of switching of the operation among the variable-gain amplifiers composing the variable-gain amplification circuit.

FIG. 16 is a diagram showing curves each representing a relation between the current of a variable-gain amplifier provided at one of the three stages of a variable-gain amplification circuit and the AGC voltage Vagc in switching processes in the variable-gain amplification circuit. To be more specific, a curve Io1 shown in FIG. 16 represents a relation between the current flowing through the current-source MOSFET 105 employed in the variable-gain amplifier 121 provided at the first stage and the AGC voltage Vagc, a curve Io2 shown in same figure represents a relation between the current flowing through the current-source MOSFET 105 employed in the variable-gain amplifier 122 provided at the second stage and the AGC voltage Vagc whereas a curve Io3 shown in FIG. 16 represents a relation between the current flowing through the current-source MOSFET 105 employed in the variable-gain amplifier 123 provided at the third stage and the AGC voltage Vagc.

A curve IoS shown in FIG. 16 represents a relation between the total current of the variable-gain amplification circuit having the three-stage configuration and the AGC voltage Vagc. The peak of the consumed current IoS is 20% higher than the peak of the consumed current of the variable-gain amplifier provided at the first stage.

FIG. 17 is a diagram showing a curve Gv representing a relation between the gain of a variable-gain amplification circuit having a three-stage configuration and the AGC voltage Vagc in switching processes of the variable-gain amplification circuit and a curve IIP3 representing a relation between the distortion at a third-order intercept point and the AGC voltage Vagc in the switching processes.

As is obvious from FIG. 17, as the gain Gv of the three-stage variable-gain amplification circuit decreases, the distortion IIP3 at the third-order intercept point increases by at least 20 dB. As a result, it is possible to realize a small-distortion variable-gain amplification circuit having a small increase in consumed current even for a large input signal.

Other Embodiments

Figure 18:
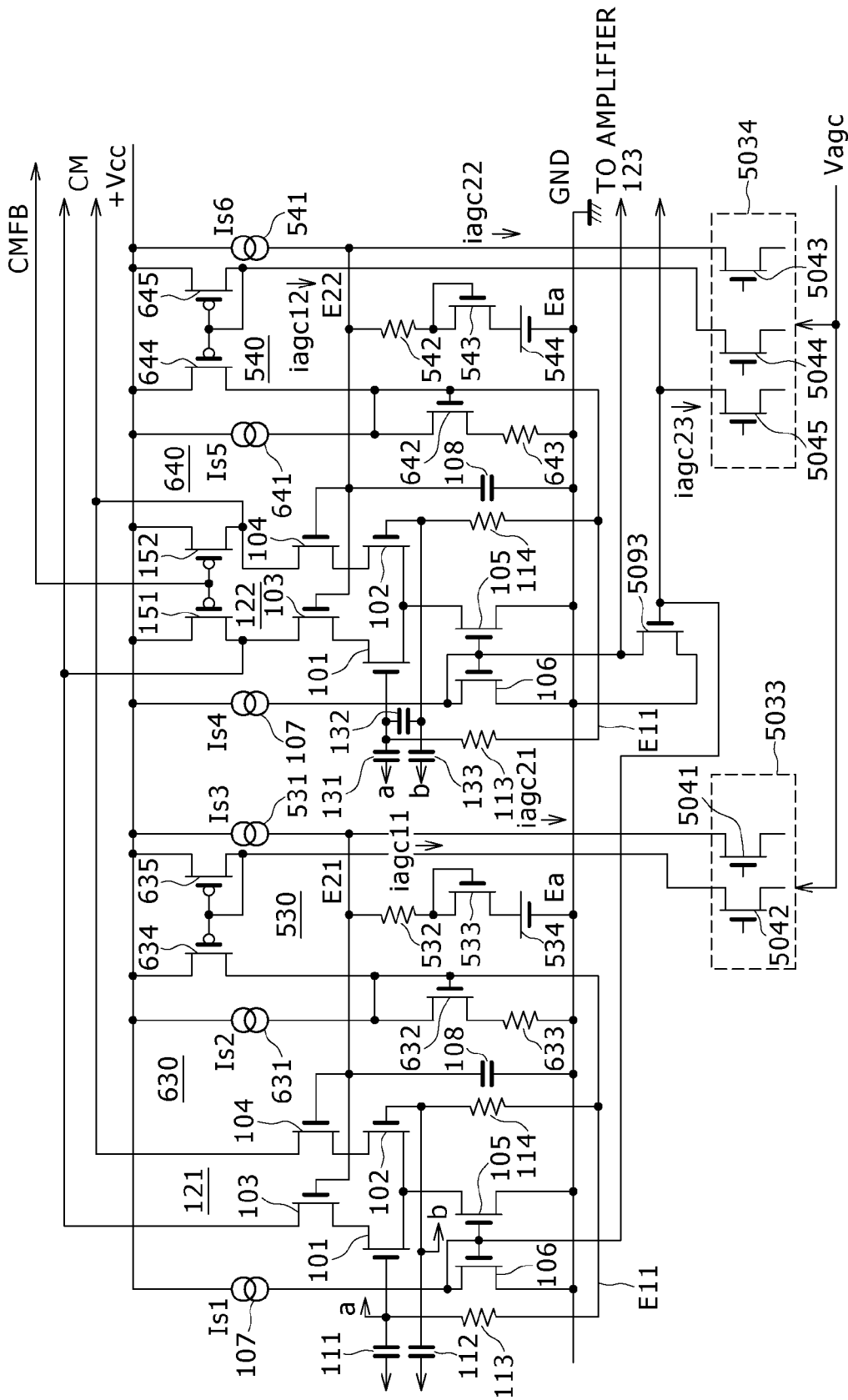
FIG. 18 is an explanatory diagram showing a first typical concrete circuit as a variable-gain amplification circuit according to an embodiment of the present invention.

FIG. 18 is a diagram showing another embodiment implementing a variable-gain amplification circuit with a multi-stage configuration. In this other embodiment, the variable-gain amplifier provided at each of the stages has a configuration identical with that of the embodiment described earlier. However, this other embodiment adopts a method for switching from one variable-gain amplifier provided at a stage to a variable-gain amplifier provided at another stage in a way different from the switching method of the embodiment described earlier.

In the embodiment shown in FIG. 14, the first voltage/current conversion circuit 5031 for converting the AGC voltage Vagc into a current iagc1 and the first gain control voltage generation circuit 510 is connected to each other by a line. By the same token, the second voltage/current conversion circuit 5032 for converting the AGC voltage Vagc into a current iagc2 and the second gain control voltage generation circuit 520 is connected to each other by a line. The currents iagc (strictly speaking, the currents iagc1 and iagc2) each flowing through the connecting line are controlled by changing the AGC voltage Vagc in order to adjust the gain control voltages E2 (strictly speaking, the gain control voltages E21 and E22). The gain control voltages E2 are controlled in order to carry out switching from one variable-gain amplifier to another in the variable-gain amplification circuit having the two-stage configuration.

In the embodiment shown in FIG. 18, on the other hand, a first voltage/current conversion circuit 5033 for converting the AGC voltage Vagc into currents and a first gain control voltage generation circuit 530 is connected to each other by two lines. By the same token, a second voltage/current conversion circuit 5034 for converting the AGC voltage Vagc into currents and a second gain control voltage generation circuit 540 is connected to each other by three lines and so on. The gain control voltages E2 (strictly speaking, the gain control voltages E21, E22, E23 and so on), the gate bias voltage E1 (strictly speaking, the gate bias voltages E11, E12, E13 and so on) and the operation currents Io are controlled by the connecting lines dedicated for them respectively as follows.

In the embodiment shown in FIG. 18, the drain of a MOSFET 5041 employed in the first voltage/current conversion circuit 5033 provided for the first variable-gain amplifier 121 as a circuit receiving the AGC voltage Vagc is connected to the power-supply line of the power supply +Vcc through a current source 531. A connection point common to the drain of the MOSFET 5041 and the current source 531 is connected to the terminal of the ground through a series circuit having a resistor 532, a diode-connected MOSFET 533 and a voltage source 534 for generating a reference voltage Ea.

The MOSFET 5041 employed in the first voltage/current conversion circuit 5033 controls a current iagc21 generated by the current source 531 in accordance with the AGC voltage Vagc received by the gate of the MOSFET 5041 in order to generate the gain control voltage E21 at a connection point common to the drain of the MOSFET 5041 and the current source 531 as a voltage to be supplied to the gates of the third MOSFET 103 and the fourth MOSFET 104, which are employed in the first variable-gain amplifier 121. That is to say, the current source 531, the resistor 532, the MOSFET 533 and the voltage source 534 form the first gain control voltage generation circuit 530.

A series circuit having a current source 631, a diode-connected MOSFET 632 and a resistor 633 is connected between the power-supply line of the power supply +Vcc and the terminal of the ground. The gates of a MOSFET 634 and a diode-connected MOSFET 635 are connected to each other to form a current-mirror configuration. The sources of the MOSFET 634 and the diode-connected MOSFET 635 are connected to the power-supply line of the power supply +Vcc. The drain of the MOSFET 634 is connected to a connection point common to the gate and drain of the diode-connected MOSFET 632. The drain of the diode-connected MOSFET 635 is connected to the drain of a MOSFET 5041 employed in the first voltage/current conversion circuit 5033.

The MOSFET 5042 employed in the first voltage/current conversion circuit 5033 controls a current iagc11 in accordance with the AGC voltage Vagc received by the gate of the MOSFET 5042 in order to adjust the gate bias voltage E11 of the first MOSFET 101 and the second MOSFET 102, which are employed in the first variable-gain amplifier 121. That is to say, the current source 631, the MOSFET 632, the resistor 633, the MOSFET 634 and the diode-connected MOSFET 635, which form a current-mirror circuit, form a first gate bias voltage generation circuit 630.

In addition, the second variable-gain amplifier 122 is provided with a second gain control voltage generation circuit 540 having a configuration completely identical with the configuration of the first gain control voltage generation circuit 530 described above. In FIG. 18, components employed in the second gain control voltage generation circuit 540 as components identical with their respective counterparts employed in the first gain control voltage generation circuit 530 are denoted by the same reference numerals as the counterparts. On top of that, the second variable-gain amplifier 122 is also provided with a second gate bias voltage generation circuit 640 having a configuration completely identical with the configuration of the first gate bias voltage generation circuit 630 described above. In FIG. 18, components employed in the second gate bias voltage generation circuit 640 as components identical with their respective counterparts employed in the first gate bias voltage generation circuit 630 are denoted by the same reference numerals as the counterparts.

A MOSFET 5043 employed in a second voltage/current conversion circuit 5034 controls a current iagc22 generated by a current source 541 in accordance with the AGC voltage Vagc received by the gate of the MOSFET 5043 in order to generate the gain control voltage E22 at a connection point common to the drain of the MOSFET 5043 and the current source 541 as a voltage to be supplied to the gates of the third MOSFET 103 and the fourth MOSFET 104, which are employed in the second variable-gain amplifier 122.

Another MOSFET 5044 employed in the second voltage/current conversion circuit 5034 controls a current iagc12 in accordance with the AGC voltage Vagc received by the gate of the MOSFET 5044 in order to adjust the gate bias voltage E12 of the first MOSFET 101 and the second MOSFET 102, which are employed in the second variable-gain amplifier 122.

A further MOSFET 5045 employed in the second voltage/current conversion circuit 5034 controls a current iagc23 in accordance with the AGC voltage Vagc received by the gate of the MOSFET 5044. The current iagc23 is supplied to the gate of the current-source MOSFET 105 employed in the first variable-gain amplifier 121 and the gate of a MOSFET 5093. The current iagc23 is also supplied to a third variable-gain amplifier 123 not shown in FIG. 18. The current iagc23 determines a timing to switch the operation among the first variable-gain amplifier 121, the second variable-gain amplifier 122 and the third variable-gain amplifier 123 provided at the three stages.

It is to be noted that the drain of the MOSFET 5093 is connected to the gate of the current-source MOSFET 105 employed in the second variable-gain amplifier 122 whereas the source of the MOSFET 5093 is connected to the terminal of the ground.

In the case of the multi-stage variable-gain amplification circuit according to the embodiment shown in FIG. 18, a condition for setting voltages at a gain maximum point is the same as the conditions for the embodiments explained earlier by referring to FIGS. 10 and 14. In the first and second gate bias voltage generation circuits 630 and 640, the product Is2×R3 (where notation Is2 denotes the currents generated by the current sources 631 and 632 whereas notation R3 denotes the resistance of the resistors 633 and 634) is used as a substitute for the reference voltage Eb cited before. In this way, the resistance R3 of the resistors 633 and 634 is used also to set the gradient of a curve representing changes in gain.

Figure 19:
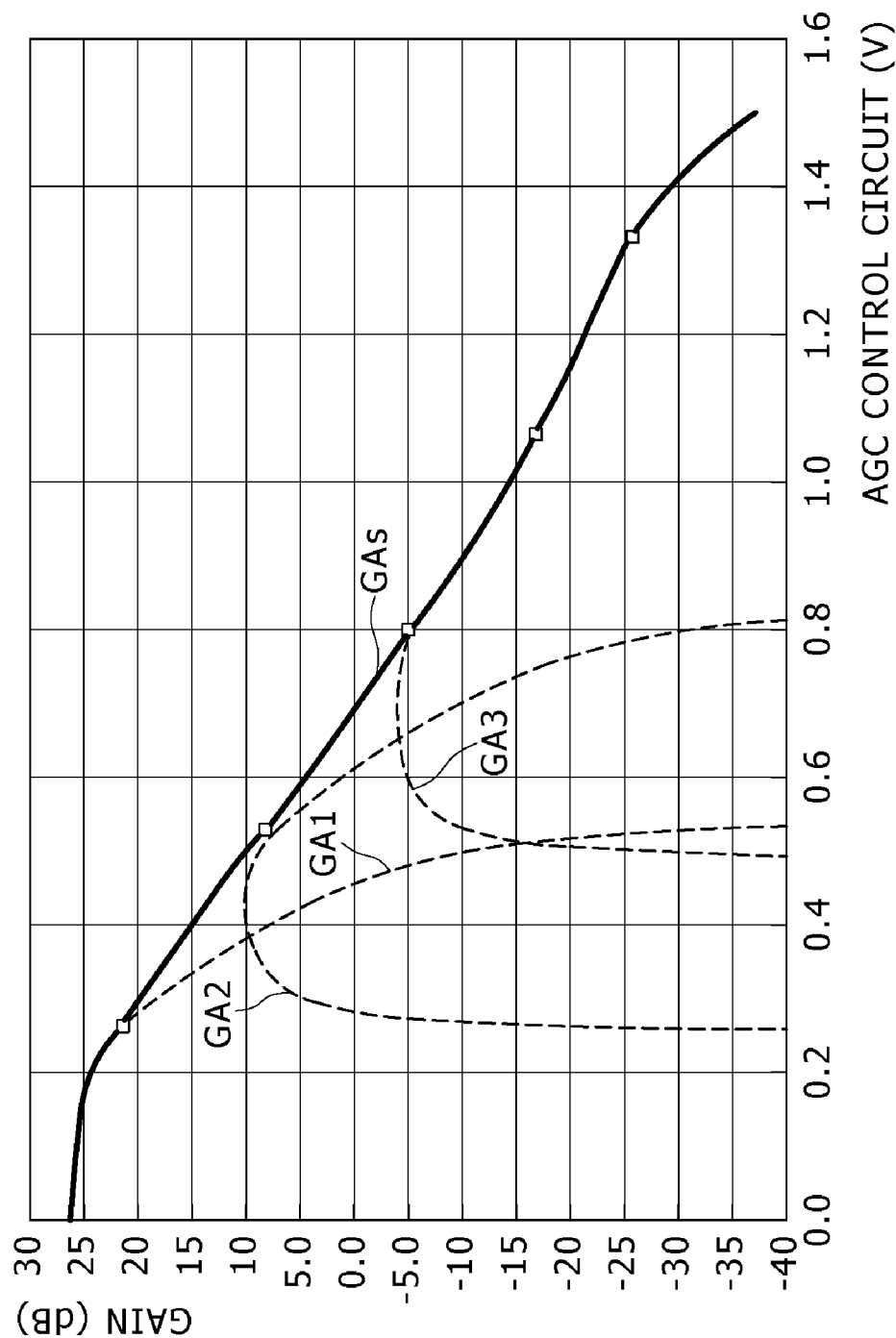
FIG. 19 is an explanatory diagram to be referred to in description of the variable-gain amplification circuit shown in FIG. 18.

FIG. 19 is a diagram showing curves each representing a relation between the gain and the AGC voltage Vagc in switching processes carried out in a variable-gain amplification circuit employing variable-gain amplifiers at a number of stages in accordance with the embodiment shown in FIG. 18. To be more specific, a curve GA1 represents a relation between the gain of the first variable-gain amplifier 121 and the AGC voltage Vagc, a curve GA2 represents a relation between the gain of the second variable-gain amplifier 122 and the AGC voltage Vagc whereas a curve GA3 represents a relation between the gain of the third variable-gain amplifier 123 and the AGC voltage Vagc. A curve GAs shown in FIG. 15 represents a relation between the gain of the variable-gain amplification circuit having a three-stage configuration and the AGC voltage Vagc. As shown in the figure, the gain of the variable-gain amplification circuit having a three-stage configuration changes with the AGC voltage Vagc over a gain variation range of at least 45 dB. In addition, the gain of the variable-gain amplification circuit having a three-stage configuration reduces smoothly in spite of switching of the operation among the variable-gain amplifiers composing the variable-gain amplification circuit.

Figure 20:
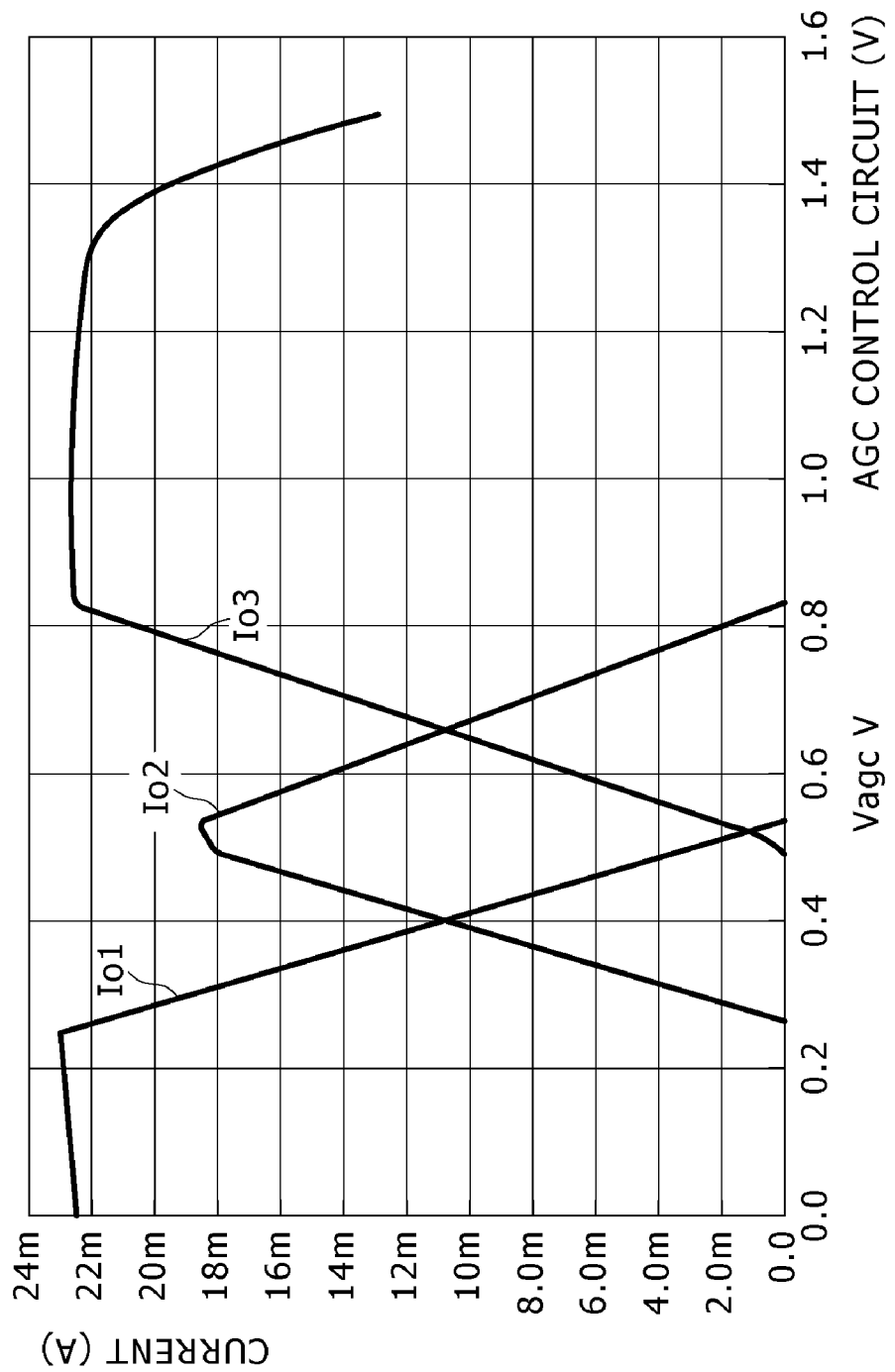
FIG. 20 is another explanatory diagram to be referred to in description of the variable-gain amplification circuit shown in FIG. 18.

FIG. 20 is a diagram showing curves each representing a relation between the operation (switching) current of a variable-gain amplifier 121, 122, and 123 provided at one of the three stages of a variable-gain amplification circuit according to the embodiment shown in FIG. 18 and the AGC voltage Vagc in switching processes in the variable-gain amplification circuit.

In the case of this embodiment, the current of the variable-gain amplifier provided at each stage is controlled directly by the AGC voltage Vagc. Thus, as shown in FIG. 20, the switching characteristic represents switching of a current, which changes linearly with the AGC voltage Vagc. In addition, the ratio of the current turned off in a switching operation to the current turned on in the switching operation is 1:1 and the current of the variable-gain amplifier provided at each stage is controlled directly by the AGC voltage Vagc. Thus, the total current of the variable-gain amplification circuit does not increase.

It is to be noted that, in the case of the embodiment shown in FIG. 18, gain variations are compensated for changes of the gate-source voltage Vgs of the MOSFET. This is because, under a bias condition corrected in the initial state, the variations in gain are represented by changes in current.

Effects of the Embodiments

1. The field-proven variable-gain method adopted by a single-end circuit to give small distortions can also be applied to a differential amplifier. Thus, it is possible to sustain the feature of giving small distortions and to reduce the consumed current.

2. It is possible to realize a variable-gain amplification circuit employing amplifiers provided at as many stages as possible as long as increases in consumed current can be ignored.

3. The gain can be changed with the balance of the differential amplifiers sustained as it is and generation of even-ordered distortions can be suppressed.

4. Since a bias circuit is used as a circuit compensating for amplifier characteristics changes of characteristics of MOSFETs in use, the number of amplifier characteristic changes caused by manufacturing process variations can be reduced.

5. Since a variable-gain method is adopted as a method, the distortion of which does not deteriorate even if the current decreases, it is not necessary to deeply consider distortion changes at a point of switching from the current of a variable-gain amplifier to the current of another variable-gain amplifier. Thus, a switching operation can be carried out with ease.

6. A high-frequency amplifier with a large dynamic range can be implemented even if operated by making use of a low driving voltage. Thus, low-voltage operations can be carried out in a receiver employing such a high-frequency amplifier.

7. By making use of the variable-gain amplification circuit according to the embodiments at the high-frequency amplification stage of a receiver, it is possible to reduce the number of noises, the number of distortions and the consumed current. In addition, the variable-gain amplification circuit can be effectively put in a single-chip IC.

OTHER MODIFICATIONS

The embodiments described above each implement a variable-gain amplification circuit put in a single-chip IC. However, the scope of the present invention is by no means limited to implementations of the variable-gain amplification circuit in a single-chip IC. As described above, nevertheless, the implementation of the variable-gain amplification circuit in a single-chip IC gives a good result.

The above descriptions explain multi-stage variable-gain amplification circuits up to three stages. It is to be noted, however, that the present invention can of course be applied to multi-stage variable-gain amplification circuits having a stage count greater than three.

In addition, in accordance with the above descriptions, the variable-gain amplification circuit provided by the present invention is applied to a high-frequency amplifier employed in a TV tuner. It is to be noted, however, that the scope of the present invention is by no means limited to a TV tuner. It is needless to say that the present invention can also be applied to apparatus other than a TV tuner.

It should also be understood by those skilled in the art that a variety of modifications, combinations, sub-combinations and alterations may occur, depending on design requirements and other factors insofar as they are within the scope of the appended claims or the equivalents thereof.

What is claimed is:

1. A variable-gain amplification circuit, wherein
the sources of first and second MOSFETs (Metal Oxide Semiconductor Field Effect Transistors) are tied to a common connection point connected to a current source,
an input signal is supplied to the gates of said first and second MOSFETs,
the drains of said first and second MOSFETs are connected to the sources of third and fourth MOSFETs respectively whereas the drains of said third and fourth MOSFETs are connected to two output terminals respectively, a gain control voltage is supplied to the gates of both said third and fourth MOSFETs, and
when control is executed in order to lower said gain control voltage supplied to said gates of both said third and fourth MOSFETs, other control is also executed in order to raise a bias voltage applied to said gates of both said first and second MOSFETs.

2. The variable-gain amplification circuit according to claim 1 wherein said gain control voltage and said bias voltage are controlled in order to keep an electric potential appearing at said connection point common to said sources of said first and second MOSFETs at an approximately constant level.

3. The variable-gain amplification circuit according to claim 1, said variable-gain amplification circuit implemented as an IC.

4. The variable-gain amplification circuit according to claim 1, wherein said variable-gain amplification circuit is provided with a compensation circuit for making said gain control voltage supplied to said gates of both said third and fourth MOSFETs protect against MOSFET-characteristic changes caused by manufacturing-process variations.

5. A variable-gain amplification circuit including a parallel circuit connected between two output terminals of said variable-gain amplification circuit as a parallel circuit comprising a plurality of differential variable-gain amplifiers each having first, second, third and fourth MOSFETs (Metal Oxide Semiconductor Field Effect Transistors) connected to each other by use of cascode coupling and each having a controllable gain, wherein
  the sources of said first and second MOSFETs are tied to a common connection point connected to a current source,
  an input signal is supplied to the gates of said first and second MOSFETs,
  the drains of said first and second MOSFETs are connected to the sources of said third and fourth MOSFETs respectively whereas the drains of said third and fourth MOSFETs are connected to said two output terminals respectively, a gain control voltage is supplied to the gates of both said third and fourth MOSFETs,
  when control is executed in order to lower said gain control voltage supplied to said gates of both said third and fourth MOSFETs, other control is also executed in order to raise a bias voltage applied to said gates of both said first and second MOSFETs, and
  said current source is controlled in order to carry out switching from a specific one of said variable-gain amplifiers to another one of said variable-gain amplifiers.

6. The variable-gain amplification circuit according to claim 5,
  wherein said input signal is supplied to one of said variable-gain amplifiers as it is but to any other one of said variable-gain amplifiers after being attenuated.

7. The variable-gain amplification circuit according to claim 5,
  wherein, for each of said variable-gain amplifiers, said gain control voltage and said bias voltage are controlled in order to keep an electric potential appearing at said connection point common to said sources of said first and second MOSFETs at an approximately constant level.

8. The variable-gain amplification circuit according to claim 5, said variable-gain amplification circuit implemented as an IC.

9. The variable-gain amplification circuit according to claim 5, said variable-gain amplification circuit provided with a compensation circuit for making said gain control voltage supplied to said gates of both said third and fourth MOSFETs protect against MOSFET-characteristic changes caused by manufacturing-process variations.

10. A receiver employing said variable-gain amplification circuit according to any one of claims 1 to 9 as a high-frequency amplifier circuit wherein automatic gain control is executed according to said input signal.

11. An IC provided for a receiver employing said variable-gain amplification circuit according to any one of claims 1 to 9 as a high-frequency amplifier circuit wherein automatic gain control is executed according to said input signal.

* * * * *